US012787598B2

(12) United States Patent
Na et al.

(10) Patent No.: US 12,787,598 B2
(45) Date of Patent: Nov. 3, 2026

(54) DIGITIZER, METHOD OF MANUFACTURING DIGITIZER, AND ELECTRONIC DEVICE INCLUDING DIGITIZER

(71) Applicant: SAMSUNG DISPLAY CO., LTD., Yongin-si (KR)

(72) Inventors: Hyunjae Na, Yongin-si (KR); Youngjin Lee, Yongin-si (KR); Seokwon Jang, Yongin-si (KR); Sunhaeng Cho, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 19/047,772

(22) Filed: Feb. 7, 2025

(65) Prior Publication Data

US 2025/0294997 A1 Sep. 18, 2025

(30) Foreign Application Priority Data

Mar. 14, 2024 (KR) ........................ 10-2024-0035771

(51) Int. Cl.
*G06F 3/046* (2006.01)
*G06F 3/041* (2006.01)
(Continued)

(52) U.S. Cl.
CPC ........... *H10K 59/80* (2023.02); *G06F 3/0416* (2013.01); *G06F 3/0446* (2019.05); *G06F 3/046* (2013.01); *H10K 59/40* (2023.02); *G06F 3/0412* (2013.01); *G06F 2203/04102* (2013.01); *G06F 2203/04107* (2013.01); *H10K 2102/311* (2023.02)

(58) Field of Classification Search
CPC .... G06F 3/0412; G06F 3/0416; G06F 3/0446; G06F 3/046; G06F 2203/04102; G06F 2203/04103; G06F 2203/04107; H10K 59/10; H10K 59/40; H10K 59/80; H10K 2102/311
See application file for complete search history.

(56) References Cited

U.S. PATENT DOCUMENTS 12,298,805 B2 * 5/2025 Shin ...................... G06F 1/1616
12,554,367 B2 * 2/2026 Yan ...................... G06F 3/0446
(Continued)

FOREIGN PATENT DOCUMENTS

CN 119028224 A * 11/2024 ............ G09F 9/301
KR 10-2022-0037007 A 3/2022
KR 10-2023-0113438 A 7/2023

*Primary Examiner* — Julie Anne Watko
(74) *Attorney, Agent, or Firm* — F. CHAU & ASSOCIATES, LLC

(57) ABSTRACT

A digitizer including: a base layer including a folding portion, a first non-folding portion and a second non-folding portion spaced apart from the first non-folding portion in a first direction with the folding portion interposed therebetween, wherein the folding portion includes a plurality of through holes; a guide pattern disposed on the base layer in the folding portion and surrounding at least a part of each of the plurality of through holes in a plan view; and a sensing line disposed on the base layer in the folding portion, positioned between the plurality of through holes in the plan view, and extending in the first direction, curving along edges of the plurality of through holes.

9 Claims, 28 Drawing Sheets

(51) Int. Cl.

| | |
|---|---|
| ***G06F 3/044*** | (2006.01) |
| ***H10K 59/40*** | (2023.01) |
| ***H10K 59/80*** | (2023.01) |
| ***H10K 59/82*** | (2023.01) |
| *H10K 102/00* | (2023.01) |

(56) References Cited

U.S. PATENT DOCUMENTS

| | | | | |
|---|---|---|---|---|
| 2016/0105950 | A1* | 4/2016 | Drzaic | B05D 3/002 156/196 |
| 2022/0238821 | A1* | 7/2022 | Cho | G06F 3/0443 |
| 2024/0324431 | A1* | 9/2024 | Kim | H10K 59/8791 |
| 2025/0238108 | A1* | 7/2025 | Jang | G06F 3/0445 |

* cited by examiner

DIGITIZER, METHOD OF MANUFACTURING DIGITIZER, AND ELECTRONIC DEVICE INCLUDING DIGITIZER

CROSS-REFERENCE TO RELATED APPLICATION

This application claims priority under 35 U.S.C. § 119 to Korean Patent Application No. 10-2024-0035771, filed on Mar. 14, 2024, in the Korean Intellectual Property Office, the disclosure of which is incorporated by reference herein in its entirety.

1. TECHNICAL FIELD

The present disclosure relates generally to a digitizer. More particularly, the present disclosure relates to a digitizer, a method of manufacturing the digitizer, and an electronic device including the digitizer.

2. DESCRIPTION OF THE RELATED ART

With the advancement of information technology, display devices have become increasingly important as the interface between users and information. For example, the use of display devices such as a liquid crystal display (LCD) device, an organic light emitting display (OLED) device, a plasma display panel (PDP) device, and a quantum dot display device is increasing.

A display device may include a digitizer that detects external inputs. For example, the digitizer can operate using electromagnetic resonance (EMR) and may include various sensing coils activated by electrical signals.

SUMMARY

Embodiments of the present disclosure provide a digitizer with a guide pattern designed to prevents cracks in a sensing line located at a folding portion.

Embodiments of the present disclosure provide a method of manufacturing the digitizer.

Embodiments of the present disclosure provide an electronic device including the digitizer.

A digitizer according to an embodiment of the present disclosure includes: a base layer including a folding portion, a first non-folding portion and a second non-folding portion spaced apart from the first non-folding portion in a first direction with the folding portion interposed therebetween, wherein the folding portion includes a plurality of through holes; a guide pattern disposed on the base layer in the folding portion and surrounding at least a part of each of the plurality of through holes in a plan view; and a sensing line disposed on the base layer in the folding portion, positioned between the plurality of through holes in the plan view, and extending in the first direction, curving along edges of the plurality of through holes.

The base layer further includes: a middle base layer; an upper base layer disposed above the middle base layer; and a lower base layer disposed under the middle base layer.

The sensing line includes: a first upper sensing line disposed on an upper surface of the middle base layer; a second upper sensing line disposed on an upper surface of the upper base layer; a first lower sensing line disposed on a lower surface of the middle base layer; and a second lower sensing line disposed on a lower surface of the lower base layer.

The digitizer further includes: a dummy line disposed in the first non-folding portion and the second non-folding portion and extending in the first direction, wherein the dummy line is disposed only on the upper base layer.

The guide pattern entirely surrounds each of the plurality of through holes in the plan view.

The sensing line includes a curved pattern with a predetermined curvature in the plan view.

Each of the plurality of through holes includes an end portion with a predetermined curvature, and the guide pattern has a shape corresponding a shape of the curved pattern and surrounds the end portion.

The base layer further includes: a matrix; and a plurality of fiber lines disposed in the matrix, alternately arranged with each other, and having a woven shape in the plan view.

A method of manufacturing a digitizer according to an embodiment of the present disclosure includes: providing a base layer that includes a folding portion; forming a plurality of dummy patterns on the base layer at the folding portion; forming a sensing line disposed between the plurality of dummy patterns in a plan view on the base layer at the folding portion; and forming a plurality of through holes and a guide pattern that surrounds at least a portion of each of the plurality of through holes by removing a portion of each of the plurality of dummy patterns and a portion of the base layer.

The base layer further includes a first non-folding portion and a second non-folding portion spaced apart from each other in a first direction with the folding portion interposed therebetween, and the sensing line disposed on the base layer at the first non-folding portion and the second non-folding portion.

The method further includes forming a dummy line at the first non-folding portion and the second non-folding portion.

The forming the sensing line and the dummy line on the base layer at the first non-folding portion and the second non-folding portion includes: forming a first upper sensing line on an upper surface of a middle base layer and forming a first lower sensing line on a lower surface of the middle base layer; forming an upper base layer covering the first upper sensing line on top of the middle base layer and forming a lower base layer covering the first lower sensing line under the middle base layer; and forming a second upper sensing line and the dummy line spaced apart from the second upper sensing line on an upper surface of the upper base layer and forming a second lower sensing line on a lower surface of the lower base layer.

The guide pattern entirely surrounds each of the plurality of through holes in the plan view.

The sensing line includes a curved pattern with a predetermined curvature in the plan view, and each of the dummy patterns includes a head portion adjacent to the curved pattern and a rod portion extending from the head portion.

In the forming the plurality of through holes and the guide pattern, a portion of the head portion and an entirety of the rod portion are removed to form the guide pattern, each of the plurality of through holes includes an end portion with a predetermined curvature, and the guide pattern has a shape corresponding a shape of the curved pattern and surrounds the end portion.

A method of manufacturing a digitizer according to an embodiment of the present disclosure includes: providing a base layer that includes a folding portion; forming a plurality of dummy patterns on the base layer at the folding portion; forming a guide pattern surrounding each of the plurality of dummy patterns in a plan view on the base layer at the folding portion; forming a sensing line disposed between the plurality of dummy patterns in the plan view on the base layer at the folding portion; and forming a plurality of through holes by removing all of the dummy patterns and a portion of the base layer, wherein each of the through holes is surrounded by the guide pattern.

All of the plurality of dummy patterns are removed using an inner side of the guide pattern as a boundary in the forming the plurality of through holes.

The base layer further includes a first non-folding portion and a second non-folding portion spaced apart from each other in a first direction with the folding portion interposed therebetween, and the sensing line is further formed on the base layer at the first non-folding portion and the second non-folding portion.

The method further includes forming a dummy line at the first non-folding portion and the second non-folding portion.

The forming the sensing line and the dummy line on the base layer at the first non-folding portion and the second non-folding portion includes: forming a first upper sensing line on an upper surface of a middle base layer and forming a first lower sensing line on a lower surface of the middle base layer; forming an upper base layer covering the first upper sensing line on top of the middle base layer and forming a lower base layer covering the first lower sensing line under the middle base layer; and forming a second upper sensing line and the dummy line spaced apart from the second upper sensing line on an upper surface of the upper base layer and forming a second lower sensing line on a lower surface of the lower base layer.

An electronic device according to an embodiment of the present disclosure includes: a display panel including a light emitting element; a power supply configured to provide power to the display panel; and a digitizer disposed under the display panel. The digitizer includes: a base layer including a folding portion, a first non-folding portion and a second non-folding portion spaced apart from the first non-folding portion in a first direction with the folding portion interposed therebetween, wherein the folding portion includes a plurality of through holes; a guide pattern disposed on the base layer in the folding portion and surrounding at least a part of each of the plurality of through holes in a plan view; and a sensing line disposed on the base layer in the folding portion, positioned between the plurality of through holes in the plan view, and extending in the first direction, curving along edges of the plurality of through holes.

A digitizer according to an embodiment of the present disclosure may include a base layer with a folding portion that includes a plurality of through holes, a guide pattern disposed on the base layer at the folding portion and surrounding at least part of each through hole in a plan view, and a sensing line disposed on the base layer at the folding portion and extending in a curved path along edges of the through holes. The sensing line may include a curved pattern having a predetermined curvature in a plan view.

Because the guide pattern surrounds at least part of each through hole in a plan view, folding the digitizer at the folding portion redistributes stress that would otherwise concentrate on the curved pattern to the guide pattern. This redistribution helps mitigate the occurrence of cracks in the curved pattern of the sensing line.

BRIEF DESCRIPTION OF THE DRAWINGS

Illustrative, non-limiting embodiments will be more clearly understood from the following detailed description taken in conjunction with the accompanying drawings.

DETAILED DESCRIPTION OF THE EMBODIMENTS

Figure 1:
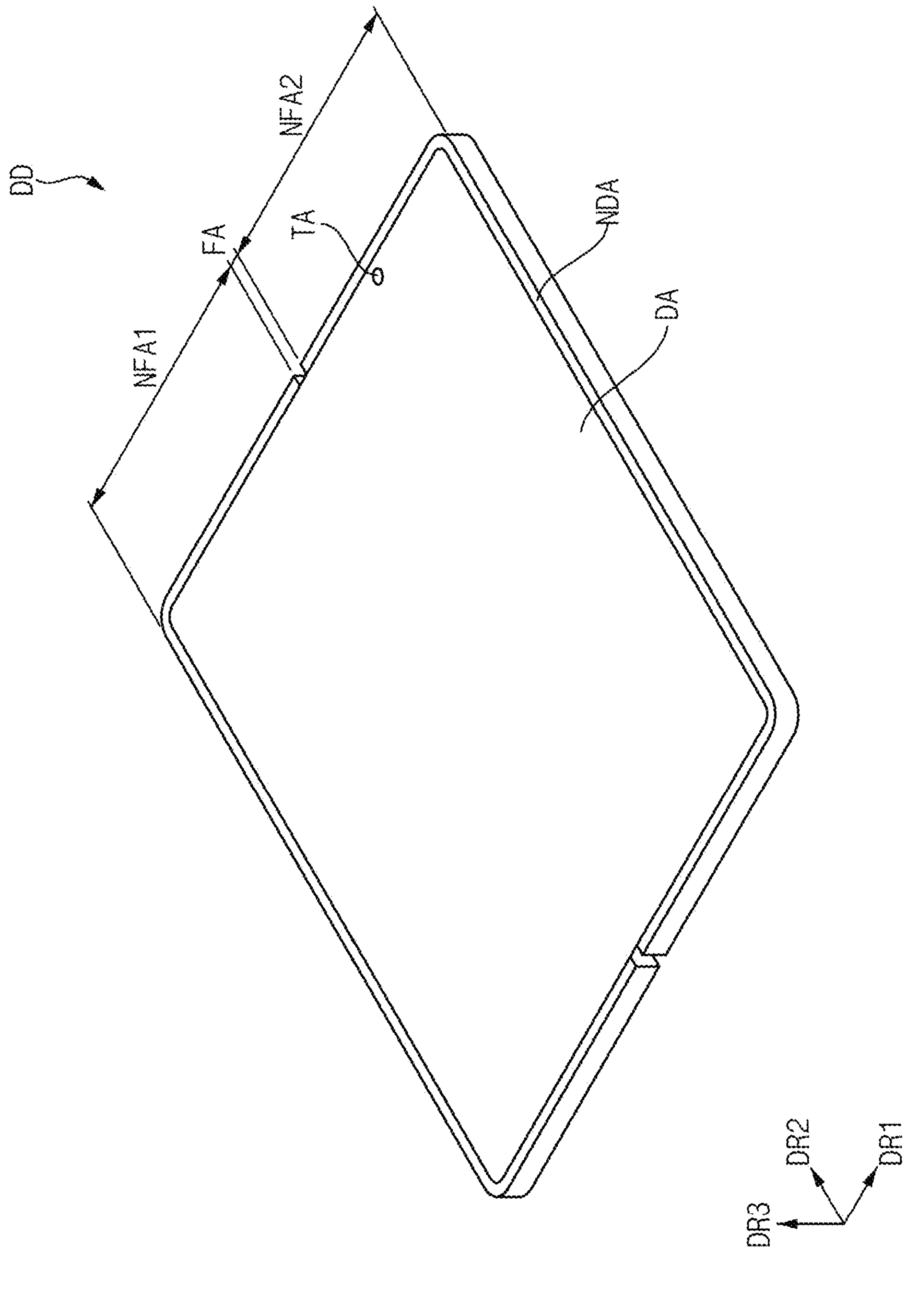
FIG. 1 is a perspective view illustrating an unfolded shape of a display device according to an embodiment of the present disclosure.

Hereinafter, embodiments of the present disclosure will be described in detail with reference to the accompanying drawings. The same reference numerals are used for identical components in the drawings, and redundant descriptions of these components will be omitted.

Figure 2:
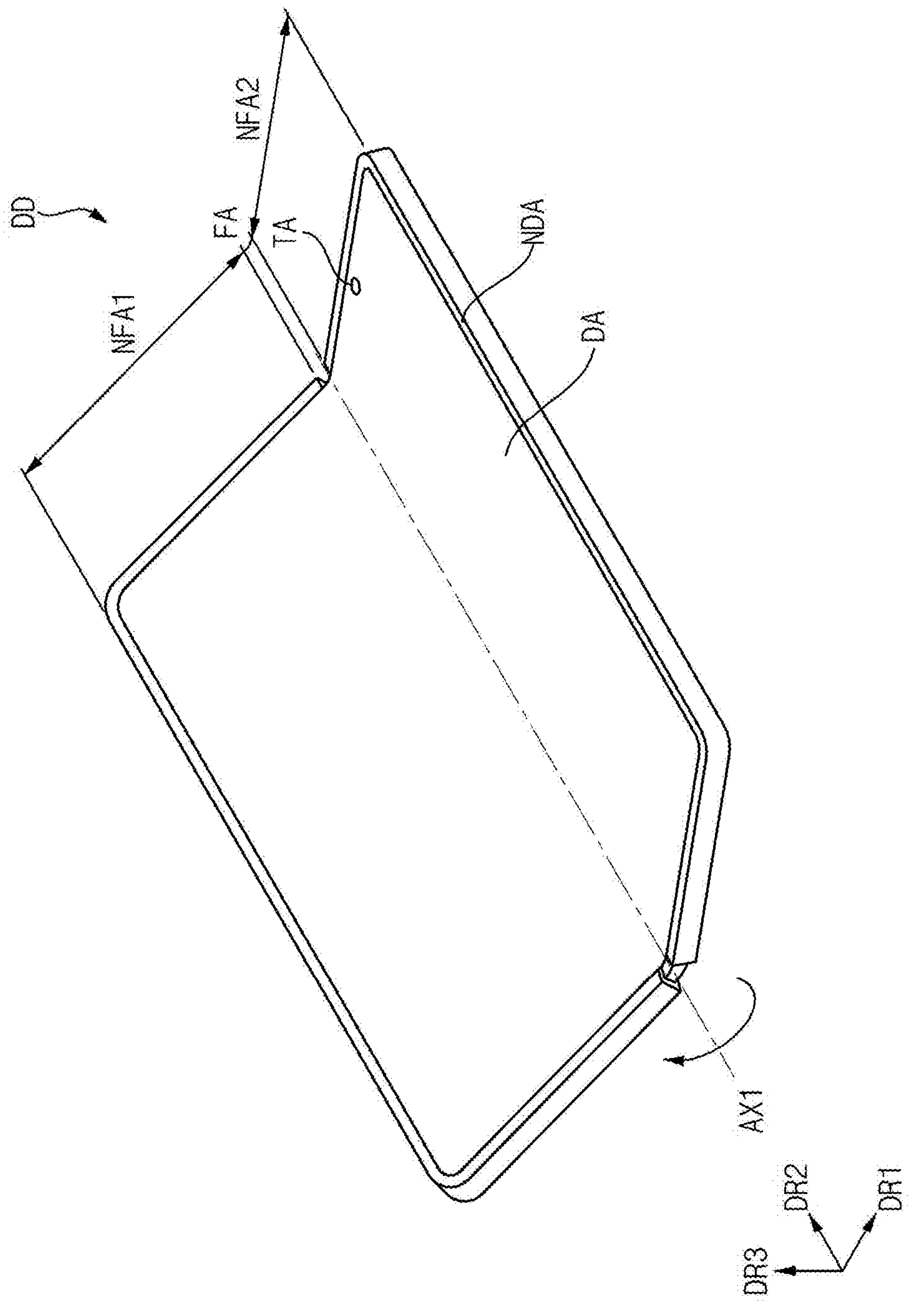
FIGS. 2 and 3 are perspective views illustrating a folded shape of the display device of FIG. 1.
Figure 3:
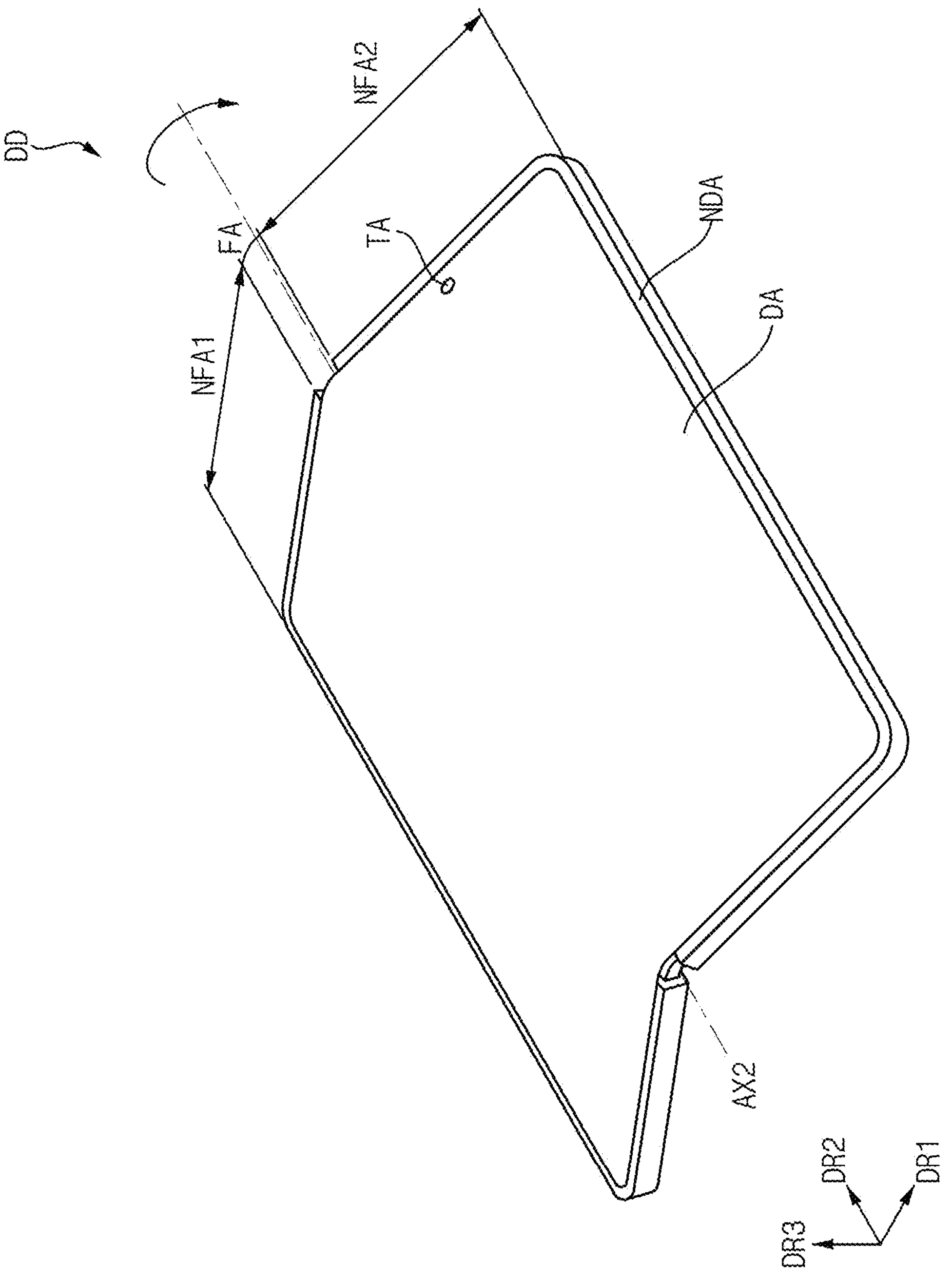

FIG. 1 is a perspective view illustrating an unfolded shape of a display device according to an embodiment of the present disclosure. FIGS. 2 and 3 are perspective views illustrating a folded shape of the display device of FIG. 1. For example, FIG. 2 is a perspective view illustrating the display device of FIG. 1 in an in-folded shape, and FIG. 3 is a perspective view illustrating the display device of FIG. 1 in an out-folded shape.

In this specification, a plane may be defined by a first direction DR1 and a second direction DR2 intersecting the first direction DR1. For example, the first direction DR1 and the second direction DR2 may be perpendicular to each other. A direction normal to the plane, e.g., a thickness direction of a display device DD may be a third direction DR3. In other words, the third direction DR3 may be perpendicular to each of the first direction DR1 and the second direction DR2.

Referring to FIGS. 1, 2, and 3, the display device DD according to an embodiment of the present disclosure may include a display area DA, a transmission area TA, and a non-display area NDA.

The display area DA may be an area where an image is displayed by generating light or adjusting the transmittance of light provided from an external light source. A plurality of pixels may be disposed in the display area DA. Each of the pixels may generate light based on a driving signal. For example, the pixels may be arranged in a matrix along the first direction DR1 and the second direction DR2.

The non-display area NDA may be an area where an image is not displayed. The non-display area NDA may be positioned on a periphery of the display area DA. The non-display area NDA may surround at least a part of the display area DA in a plan view. For example, the non-display area NDA may entirely surround (e.g., completely encircle) the display area DA in a plan view.

The transmission area TA may have a transmittance greater than that of both the display area DA and the non-display area NDA. Natural light, visible light, infrared light, and other types of light may pass through the transmission area TA into the display device DD. The display device DD may further include a sensor that captures external images using visible light passing through the transmission area TA or detects the approach (or proximity) of external objects using infrared light. The sensor may overlap the transmission area TA in a plan view. The transmission area TA may be positioned inside the display area DA. However, the present disclosure is not limited thereto, and the transmission area TA may be positioned inside the non-display area NDA, or may be surrounded by the display area DA and the non-display area NDA.

As illustrated in FIG. 2, the display device DD according to an embodiment of the present disclosure may be a foldable display device. For example, the display device DD may be foldable along an imaginary first folding axis AX1 extending in the second direction DR2.

The display device DD may include a folding area FA that folds along the first folding axis AX1, as well as a first non-folding area NFA1 and a second non-folding area NFA2, which are spaced apart from each other in the first direction DR1 with the folding area FA between them.

The display device DD may be folded using an in-folding method along the first folding axis AX1. In this context, the in-folding method may refer to folding in such a way that the first non-folding area NFA1 and the second non-folding area NFA2 face each other. However, the present disclosure is not limited thereto.

As illustrated in FIG. 3, the display device DD may be folded along an imaginary second folding axis AX2 extending in the second direction DR2. In this case, the display device DD may be folded using an out-folding method along the second folding axis AX2. In this context, the out-folding method may refer to folding in a direction where the first non-folding area NFA1 and the second non-folding area NFA2 are oriented in opposite directions.

In an embodiment, the display device DD may be operated using only one of the in-folding method and the out-folding method. In another embodiment, the display device DD may be capable of operating with both the in-folding and out-folding methods along a single folding axis.

Figure 4:
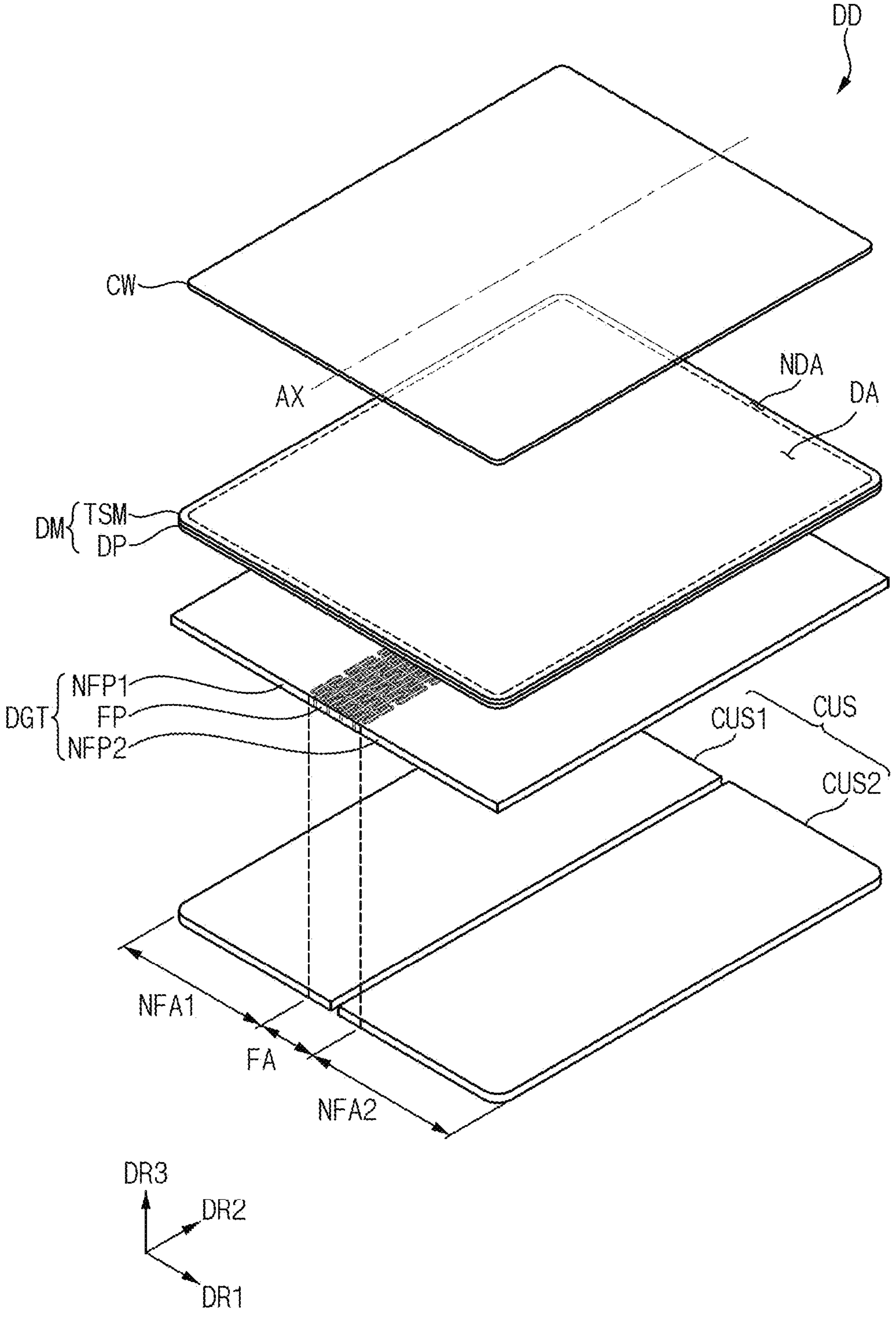
FIG. 4 is an exploded perspective view illustrating the display device of FIG. 1.
Figure 5:
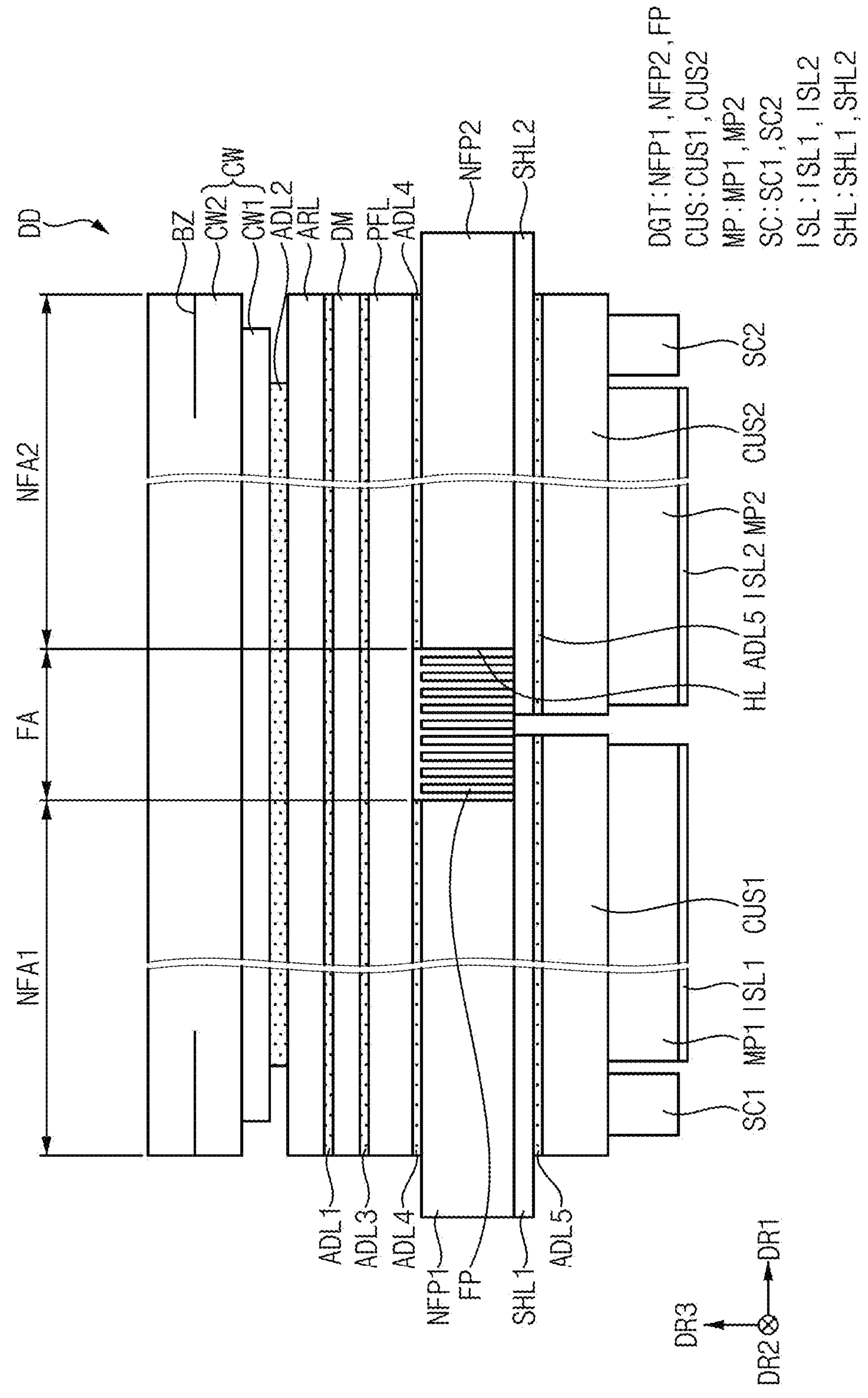
FIG. 5 is a cross-sectional view illustrating the display device of FIG. 1.

FIG. 4 is an exploded perspective view illustrating the display device of FIG. 1. FIG. 5 is a cross-sectional view illustrating the display device of FIG. 1.

Referring to FIGS. 4 and 5, the display device DD according to an embodiment of the present disclosure may include a display module DM, upper functional layers disposed on the display module DM, and lower functional layers disposed under the display module DM. The upper functional layers may include an anti-reflection layer ARL and a cover window CW. The lower functional layers may include a protective layer PFL, a digitizer DGT, a shielding layer SHL, a cushioning layer CUS, a metal plate MP, a step compensation member SC, and a lower insulating layer ISL.

The display module DM may include a display panel DP and a touch member TSM. The display panel DP may include a plurality of light emitting elements that emit light. Each of the plurality of light emitting elements may include a lower electrode, a light emitting layer, and an upper electrode. A hole in the lower electrode and an electron in the upper electrode may combine to form an exciton in the light emitting layer. The light emitting layer may then emit light as the exciton transitions from an excited state to a ground state. The light emitting layer may emit light having a specific color (e.g., red, green, or blue). For example, the light emitting layer may include at least one of an organic light emitting material and a quantum dot.

The touch member TSM may be disposed on the display panel DP. The touch member TSM may be directly disposed on the display panel DP. In other words, the touch member TSM may be directly disposed on the display panel DP without an adhesive member. In an alternative embodiment, the touch member TSM may be attached to an upper surface of the display panel DP through an adhesive member.

The touch member TSM may detect a user's touch. For example, the touch member TSM may acquire coordinate information based on an external input, such as the user's touch using methods such as mutual capacitance method or self-capacitance. The touch member TSM may include a plurality of touch electrodes, routing lines connected to the corresponding touch electrodes, and at least one touch insulating layer.

The anti-reflection layer ARL may be disposed on the touch member TSM. The anti-reflection layer ARL may be attached to an upper surface of the display module DM through a first adhesive layer ADL1. Specifically, the anti-reflection layer ARL may be attached to an upper surface of the touch member TSM through the first adhesive layer ADL1. The anti-reflection layer ARL may reduce the reflection of external light on the display device DD. In an embodiment, the anti-reflection layer ARL may include a polarizer and/or a phase retarder. In an alternative embodiment, the anti-reflection layer ARL may include color filters and a black matrix disposed between the color filters.

The first adhesive layer ADL1 may be disposed between the display module DM and the anti-reflection layer ARL. The first adhesive layer ADL1 may attach the display module DM and the anti-reflection layer ARL.

The cover window CW may be disposed on the anti-reflection layer ARL. The cover window CW may include a transparent material to allow light provided by the display module DM to pass through to the outside. In an embodiment, the cover window CW may include a flexible material. Accordingly, the cover window CW may be foldable about the folding axis AX. The cover window CW may include a first cover layer CW1, a second cover layer CW2, and a bezel pattern BZ.

The first cover layer CW1 may be disposed on the anti-reflection layer ARL. The first cover layer CW1 may be attached to an upper surface of the anti-reflection layer ARL through a second adhesive layer ADL2. The first cover layer CW1 may include thin glass or synthetic resin. For example, the synthetic resin may include polyimide (PI) or polyethylene terephthalate (PET).

The second adhesive layer ADL2 may be disposed between the anti-reflection layer ARL and the first cover layer CW1. The second adhesive layer ADL2 may attach the anti-reflection layer ARL and the first cover layer CW1.

The second cover layer CW2 may be disposed on the first cover layer CW1. The second cover layer CW2 may include a material having a modulus that is lower than a modulus of the first cover layer CW1. In addition, the second cover layer CW2 may have a thickness (or, a length in the third direction DR3) that is greater than a thickness of the first cover layer CW1. Accordingly, the second cover layer CW2 may protect the first cover layer CW1. For example, the second cover layer CW2 may have a multi-layer structure. In an embodiment, the second cover layer CW2 may include an anti-fingerprint layer.

The bezel pattern BZ may be disposed inside the second cover layer CW2. The bezel pattern BZ may overlap an edge part of the second cover layer CW2. The bezel pattern BZ may include an organic material including a light blocking material with black color.

The protective layer PFL may be disposed under the display module DM. The protective layer PFL may be attached to a lower surface of the display module DM through a third adhesive layer ADL3. The protective layer PFL may protect the display module DM from an external impact. The protective layer PFL may include a flexible organic material. For example, the protective layer PFL may include polyethylene terephthalate (PET), polyimide (PI), polyethylene naphthalate (PEN), etc. These may be used alone or in combination with each other.

The third adhesive layer ADL3 may be disposed between the display module DM and the protective layer PFL. The third adhesive layer ADL3 may attach the display module DM and the protective layer PFL.

The digitizer DGT may be disposed under the protective layer PFL. The digitizer DGT may be attached to a lower surface of the protective layer PFL through a fourth adhesive layer ADL4. The digitizer DGT may detect an input from an electromagnetic pen. For example, the digitizer DGT may be driven using electromagnetic resonance (EMR). The digitizer DGT may include a first non-folding portion NFP1, a second non-folding portion NFP2, and a folding portion FP.

The first non-folding portion NFP1 may at least partially overlap the first non-folding area NFA1. The second non-folding portion NFP2 may at least partially overlap the second non-folding area NFA2. The folding portion FP may overlap the folding area FA. The folding portion FP may be disposed between the first non-folding portion NFP1 and the second non-folding portion NFP2. In other words, the first non-folding portion NFP1 may be spaced apart from the second non-folding portion NFP2 in the first direction DR1 with the folding portion FP interposed therebetween.

A plurality of through holes HL may be provided in the folding portion FP. The through holes HL may penetrate the folding portion FP in a thickness direction (or in the third direction DR3). The through holes HL may be spaced apart from each other in the first direction DR1. In addition, the through holes HL may be spaced apart from each other in the second direction DR2. The digitizer DGT may further include a guide pattern (GDP, see FIG. 8) surrounding at least a part of each of the through holes HL in a plan view and a sensing line (e.g., a first extension sensing line EL1 of FIG. 8) that extends in the first direction DR1 and is curved along edges of the through holes HL in a plan view. A detailed description thereof will be provided below with reference to FIG. 8.

The fourth adhesive layer ADL4 may be disposed between the protective layer PFL and the digitizer DGT. Specifically, the fourth adhesive layer ADL4 may include a first portion and a second portion. The first portion of the fourth adhesive layer ADL4 may be spaced apart from the second portion of the fourth adhesive layer ADL4 in the first direction DR1 by the folding area FA. The first portion of the fourth adhesive layer ADL4 may attach a part of the protective layer PFL and the first non-folding portion NFP1. The second portion of the fourth adhesive layer ADL4 may attach another part of the protective layer PFL and the second non-folding portion NFP2.

The shielding layer SHL may be disposed under the digitizer DGT. The shielding layer SHL may be disposed on a lower surface of the digitizer DGT without an adhesive member. The shielding layer SHL may shield (e.g., block) electromagnetic interference noise. The shielding layer SHL may include a metal. For example, the shielding layer SHL may include magnetic metal powder (MMP). However, the present disclosure is not limited thereto, and the shielding layer SHL may include permalloy, which is an alloy of nickel (Ni) and iron (Fe), invar, stainless steel, etc. These may be used alone or in combination with each other.

The shielding layer SHL may include a first shielding layer SHL1 and a second shielding layer SHL2. The first shielding layer SHL1 may be spaced apart from the second shielding layer SHL2 in the first direction DR1 in the folding area FA. The first shielding layer SHL1 may overlap the first non-folding portion NFP1 and a part of the folding portion FP. The second shielding layer SHL2 may overlap the second non-folding portion NFP2 and another part of the folding portion FP. However, the present disclosure is not limited thereto, and the shielding layer SHL may entirely overlap the folding area FA and cover the through holes HL.

The cushioning layer CUS may be disposed under the shielding layer SHL. The cushioning layer CUS may be attached to a lower surface of the shielding layer SHL through a fifth adhesive layer ADL5. The cushioning layer CUS may protect the display module DM from an external impact. In addition, the cushioning layer CUS may prevent foreign materials from entering the through-holes HL when the display device DD is unfolded (in other words, when the display device DD is not folded). For example, the cushioning layer CUS may include foam tape or a foam pad.

The cushioning layer CUS may include a first cushioning layer CUS1 and a second cushioning layer CUS2. The first cushion layer CUS1 may be spaced apart from the second cushion layer CUS2 in the first direction DR1 in the folding area FA. The first cushioning layer CUS1 may overlap the first shielding layer SHL1. In addition, the first cushioning layer CUS1 may overlap the first non-folding portion NFP1 and a part of the folding portion FP in a plan view. The second cushioning layer CUS2 may overlap the second shielding layer SHL2. In addition, the second cushioning layer CUS2 may overlap the second non-folding portion NFP2 and another part of the folding portion FP in a plan view. Since the first cushioning layer CUS1 is spaced apart from the second cushioning layer CUS2 in the first direction DR1 within the folding area FA, the shape of the digitizer DGT may be easily deformed when the folding portion FP is folded (or bent) with a predetermined curvature.

The fifth adhesive layer ADL5 may be disposed between the shielding layer SHL and the cushioning layer CUS. Specifically, the fifth adhesive layer ADL5 may include a first part and a second part. The first part of the fifth adhesive layer ADL5 may be spaced apart from the second part of the fifth adhesive layer ADL5 in the first direction DR1 in the folding area FA. The first part of the fifth adhesive layer ADL5 may attach the first shielding layer SHL1 and the first cushioning layer CUS1. The second part of the fifth adhesive layer ADL5 may attach the second shielding layer SHL2 and the second cushioning layer CUS2.

The metal plate MP, the step compensation member SC, and the lower insulating layer ISL may be disposed under the cushioning layer CUS.

The metal plate MP may protect the display module DM from an external impact. For example, the metal plate MP may include stainless steel. The metal plate MP may include a first metal layer MP1 and a second metal layer MP2. The first metal layer MP1 may contact the first cushioning layer CUS1, and the second metal layer MP2 may contact the second cushioning layer CUS2.

The step compensation member SC may include a double-sided tape or an insulating film. The step compensation member SC may include a first step compensation layer SC1 and a second step compensation layer SC2. The first step compensation layer SC1 may contact the first cushioning layer CUS1 and may be adjacent to the first metal layer MP1. The second step compensation layer SC2 may contact the second cushioning layer CUS2 and may be adjacent to the second metal layer MP2.

The lower insulating layer ISL may be disposed under the metal plate MP. The lower insulating layer ISL may block noise such as static electricity generated from the outside. The lower insulating layer ISL may include an inorganic insulating material and/or an organic insulating material. The lower insulating layer ISL may include a first lower insulating layer ISL1 and a second lower insulating layer ISL2. The first lower insulating layer ISL1 may contact the first metal layer MP1, and the second lower insulating layer ISL2 may contact the second metal layer MP2.

Figure 6:
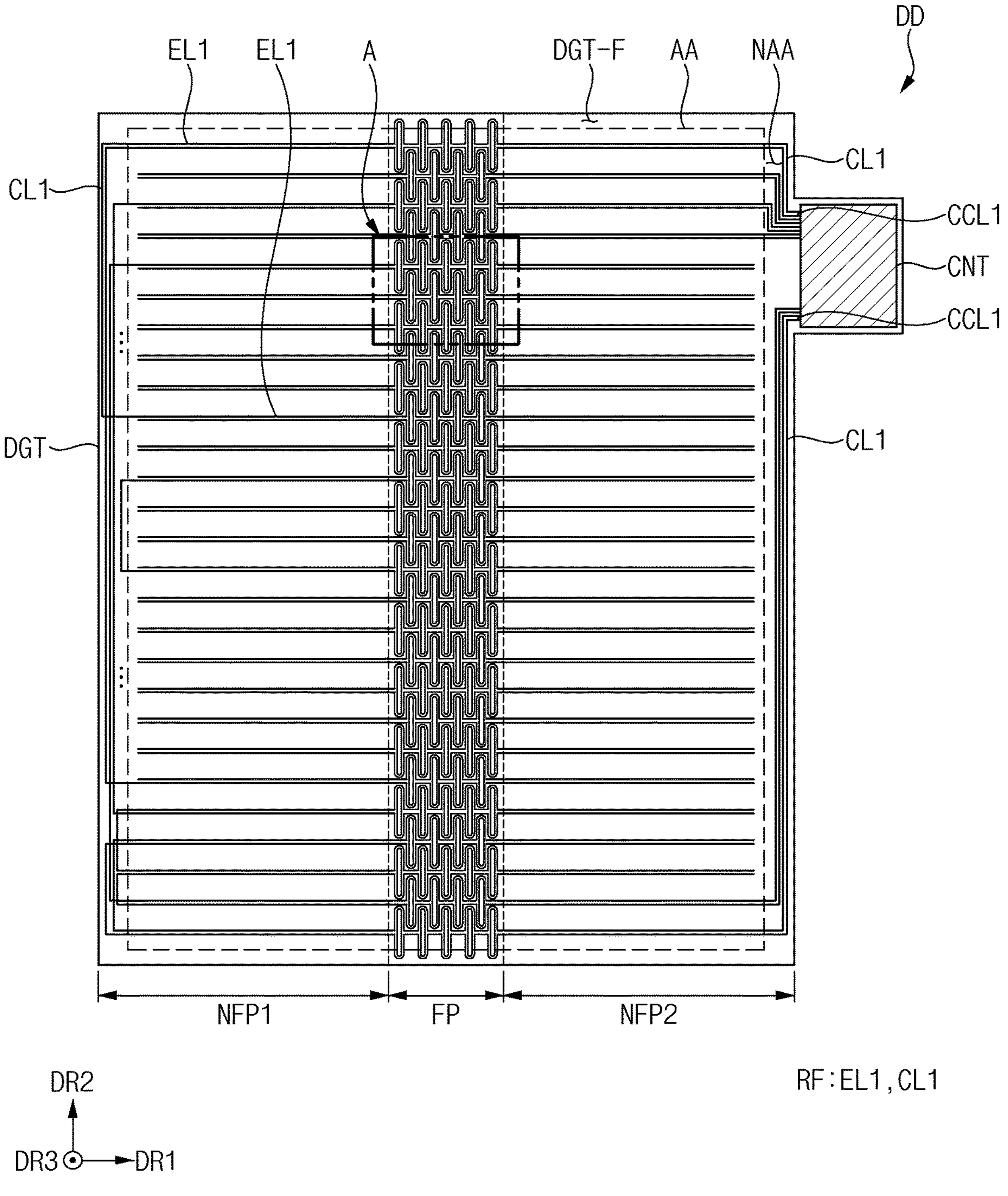
FIGS. 6 and 7 are plan views illustrating a digitizer according to an embodiment of the present disclosure.
Figure 7:
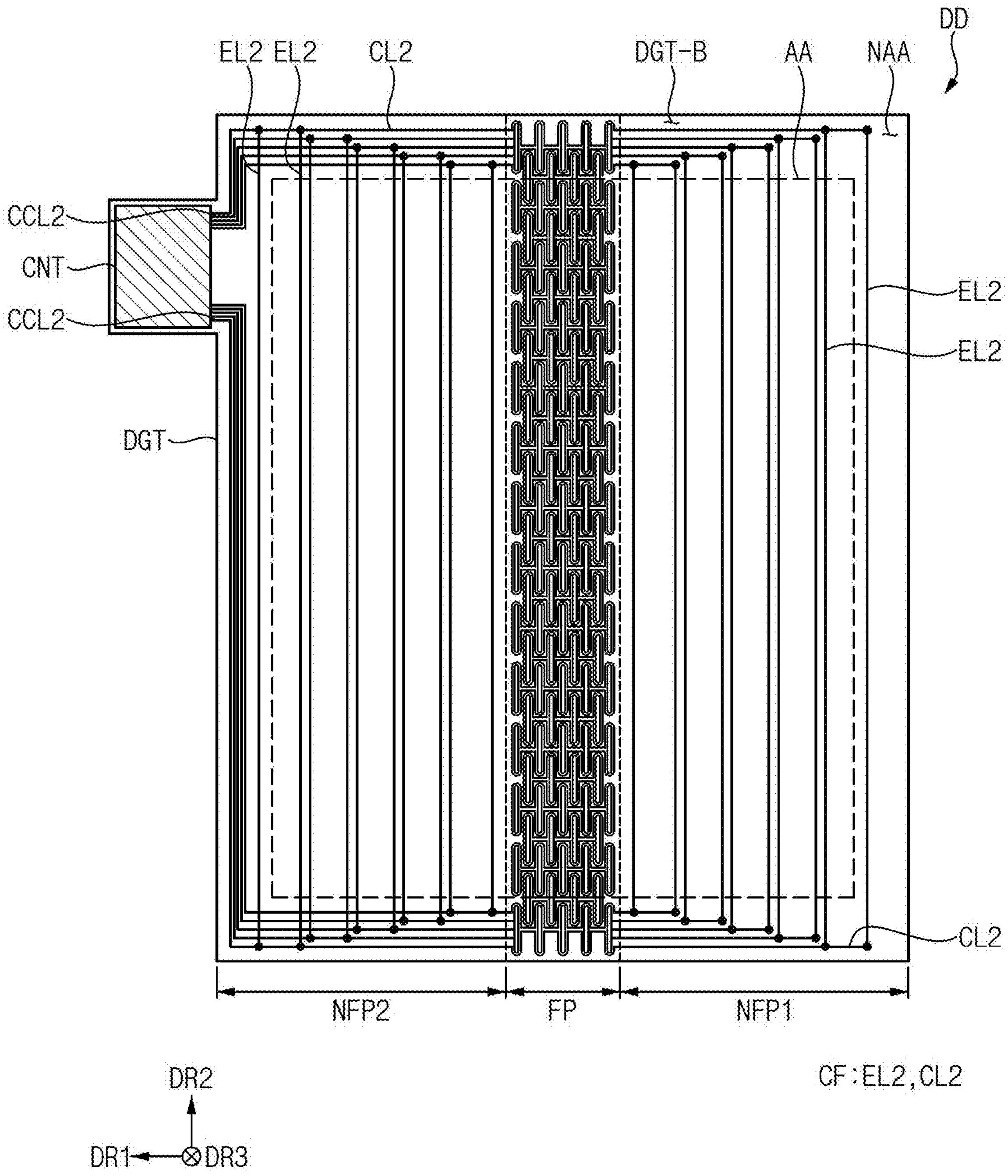

FIGS. 6 and 7 are plan views illustrating a digitizer according to an embodiment of the present disclosure. For example, FIG. 6 is a plan view illustrating sensing coils disposed at a front surface DGT-F of the digitizer DGT, and FIG. 7 is a plan view illustrating sensing coils disposed at a back surface DGT-B of the digitizer DGT.

Referring to FIG. 6, the digitizer DGT according to an embodiment of the present disclosure may include an active area AA and an inactive area NAA. The active area AA may be an area that detects an input from a pen. The active area AA may overlap the display area DA of FIG. 4. The inactive area NAA may surround the active area AA. The inactive area NAA may overlap the non-display area NDA of FIG. 4.

The digitizer DGT may include a plurality of first sensing coils RF, a plurality of first connector connection lines CCL1, and a connector CNT.

The connector CNT may be disposed at one side of the digitizer DGT. For example, the connector CNT may be disposed at a right side of the inactive area NAA. In other words, the connector CNT may be disposed in the second non-folding portion NFP2.

The first connector connection lines CCL1 may be disposed at the one side of the digitizer DGT. For example, the first connector connection lines CCL1 may be disposed at the right side of the inactive area NAA. In other words, the first connector connection lines CCL1 may be disposed in the second non-folding portion NFP2. The first connector connection lines CCL1 may be disposed along the second direction DR2. In addition, each of the first connector connection lines CCL1 may extend in the first direction DR1. A first end of the first connector connection lines CCL1 may be connected with the connector CNT, and a second end of the first connector connection lines CCL1 may be connected with the first sensing coils RF.

The first sensing coils RF may be disposed in the active area AA and the inactive area NAA. The first sensing coils RF may extend from the second non-folding portion NFP2 to the first non-folding portion NFP1. The first sensing coils RF may extend in an open loop shape. For example, the first sensing coils RF may extend from the right side of the inactive area NAA, through the active area AA, to the left side of the inactive area NAA, and then loop back to the active area AA to the right side of the inactive area NAA, maintaining an open loop shape. The first sensing coils RF may be connected with the first connector connection lines CCL1. The first sensing coils RF may be connected to the connector CNT through the first connector connection lines CCL1.

Each of the first sensing coils RF may include a plurality of first extension sensing lines EL1 and a plurality of first connection sensing lines CL1.

The first extension sensing lines EL1 may be disposed in the active area AA and the inactive area NAA. The first extension sensing lines EL1 may be disposed along the second direction DR2. Each of the first extension sensing lines EL1 may extend in the first direction DR1. For example, each of the first sensing coils RF may include at least a pair of first extension sensing lines EL1, and the pair of first extension sensing lines EL1 may extend in the first direction DR1.

The first extension sensing lines EL1 may be disposed at the first non-folding portion NFP1, the second non-folding portion NFP2, and the folding portion FP. The first extension sensing lines EL1 may extend between the through holes HL at the folding portion FP. In an embodiment, the first extension sensing lines EL1 may extend to be curved along edges of the through holes HL at the folding portion FP. In other words, the first extension sensing lines EL1 may extend in a curved path along edges of the through holes HL at the folding portion FP.

Accordingly, each of the first extension sensing lines EL1 may include a curved pattern (RP, see FIG. 8) with a predetermined curvature. A detailed description thereof will be described below with reference to FIG. 8.

In an embodiment, the first extension sensing lines EL1 may include a first upper sensing line (UL1, see FIG. 9) and a second upper sensing line (UL2, see FIG. 9) disposed at different layers. For example, the first upper sensing line may be disposed under the second upper sensing line. A detailed description thereof will be described below with reference to FIG. 9.

Dummy lines (DML, see FIG. 9) may be disposed between the first extension sensing lines EL1. In other words, the dummy lines may be spaced apart from the first extension sensing lines EL1 in the second direction DR2. The dummy lines may be disposed at the first non-folding portion NFP1 and the second non-folding portion NFP2. The dummy lines may not be disposed at the folding portion FP. The dummy lines may be disposed along the second direction DR2. Each of the dummy lines may extend in the first direction DR1.

The first connection sensing lines CL1 may be disposed in the inactive area NAA. For example, the first connection sensing lines CL1 may be disposed at the left side of the inactive area NAA and the right side of the inactive area NAA. Each of the first connection sensing lines CL1 may extend in the second direction DR2.

The first connection sensing lines CL1 may be disposed in the first non-folding portion NFP1 and the second non-folding portion NFP2. The first connection sensing lines CL1 may be connected with the first extension sensing lines EL1. For example, the first connection sensing line CL1 may be connected with a first end of the first extension sensing line EL1 at the left side of the inactive area NAA. In addition, the first connection sensing lines CL1 may be connected with the first connector connection lines CCL1. For example, the first connection sensing line CL1 may be connected with a second end of the first extension sensing line EL1 and the first connector connection line CCL1 at the right side of the inactive area NAA.

Referring further to FIG. 7, the digitizer DGT may include a plurality of second sensing coils CF, a plurality of second connector connecting lines CCL2, and the connector CNT.

The second connector connection lines CCL2 may be disposed at the one side of the digitizer DGT. For example, the second connector connection lines CCL2 may be disposed in the second non-folding portion NFP2. The second connector connection lines CCL2 may be disposed along the second direction DR2. In addition, each of the second connector connection lines CCL2 may extend in the first direction DR1. A first end of the second connector connection lines CCL2 may be connected with the connector CNT, and a second end of the second connector connection lines CCL2 may be connected with the second sensing coils CF.

The second sensing coils CF may be disposed in the active area AA and the inactive area NAA. The second sensing coils CF may extend in an open loop shape. For example, the second sensing coils CF may extend from an upper side of the inactive area NAA through the active area AA to a lower side of the inactive area NAA, and then loop back to the active area AA to the upper side of the inactive area NAA, forming an open loop shape. The second sensing coils CF may be connected with the second connector connection lines CCL2. The second sensing coils CF may be connected to the connector CNT through the second connector connection lines CCL2.

Each of the second sensing coils CF may include a plurality of second extension sensing lines EL2 and a plurality of second connection sensing lines CL2.

The second extension sensing lines EL2 may be disposed in the active area AA and the inactive area NAA. The second extension sensing lines EL2 may be disposed along the first direction DR1. Each of the second extension sensing lines EL2 may extend in the second direction DR2.

The second extension sensing lines EL2 may be disposed in the first non-folding portion NFP1, the second non-folding portion NFP2, and the folding portion FP. In the folding portion FP, each of the second extension sensing lines EL2 may extend in the second direction DR2 while passing between adjacent through holes HL.

In an embodiment, the second extension sensing lines EL2 may be disposed under the first extension sensing lines EL1. In other words, the second sensing coils CF may be disposed under the first sensing coils RF.

The second connection sensing lines CL2 may be disposed in the active area AA and the inactive area NAA. The second connection sensing lines CL2 may be disposed in the first non-folding portion NFP1, the second non-folding portion NFP2, and the folding portion FP. The second connection sensing line CL2 may be connected with the second extension sensing line EL2 and the second connector connection line CCL2. For example, the second connection sensing line CL2 may be connected with a first end of the second extension sensing line EL2 and the second connector connecting line CCL2 at the upper side of the inactive area NAA. In addition, the second connection sensing line CL2 may be connected with a second end of the second extension sensing line EL2 and the second connector connecting line CCL2 at the lower side of the inactive area NAA.

The second connection sensing lines CL2 may extend between the through holes HL in the folding portion FP. In an embodiment, the second connection sensing lines CL2 may extend in a curved path along the edges of the through holes HL in the folding portion FP. The second connection sensing lines CL2 may be connected to the second extension sensing line EL2, which extends between the adjacent through holes in the folding portion FP.

For example, the first sensing coils RF may be sensing coils and the second sensing coils CF may be driving coils. When current is applied to the second sensing coils CF, a magnetic field may be generated between the second sensing coils CF and the first sensing coils RF. The first sensing coils RF may detect the induced electromagnetic force from an electromagnetic pen and output a sensing signal to one terminal of each of the first sensing coils RF. However, the present disclosure is not limited thereto, and the first sensing coils RF may be driving coils and the second sensing coils CF may be sensing coils.

Figure 8:
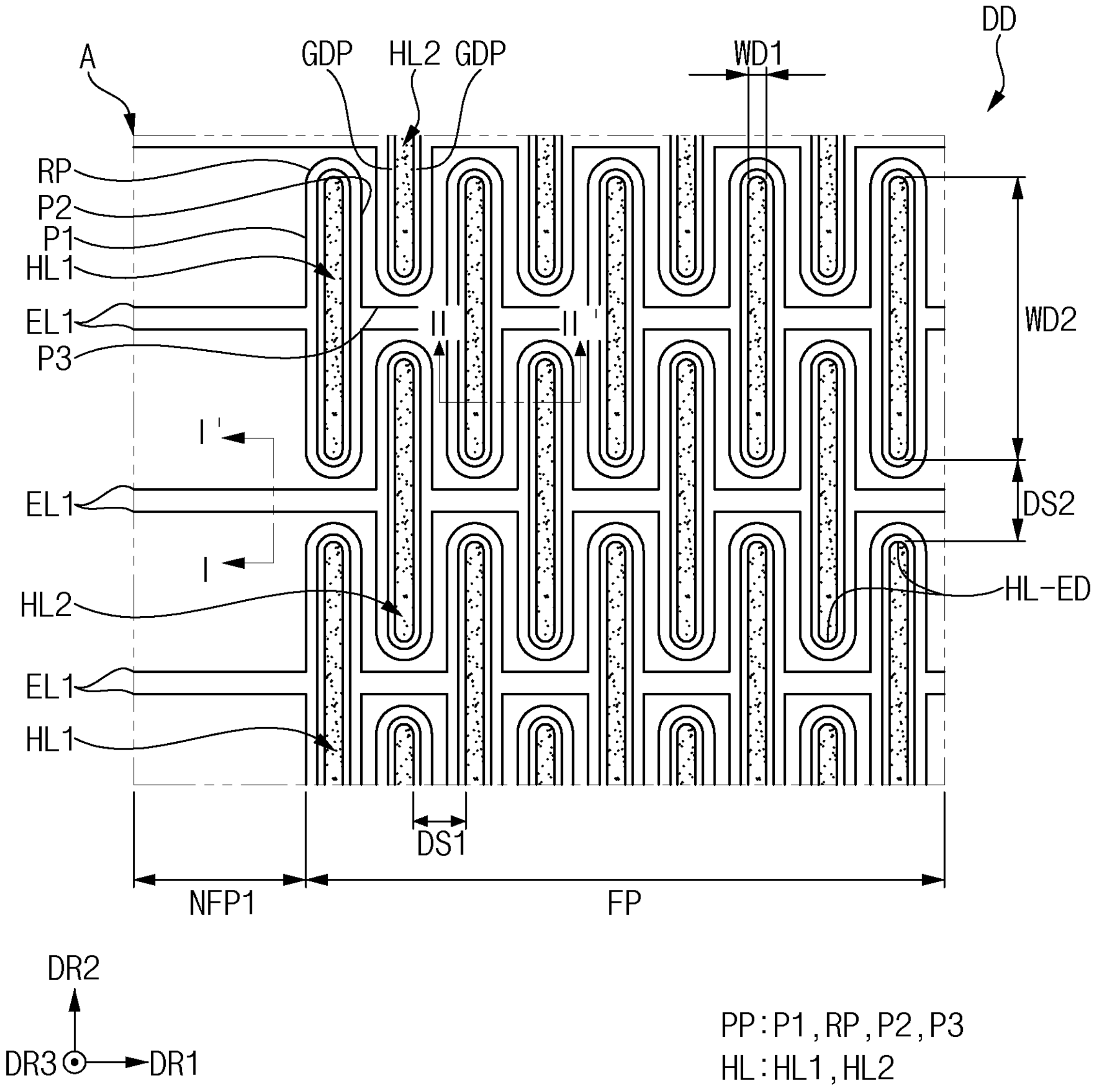
FIG. 8 is an enlarged plan view of the area A of FIG. 6.

FIG. 8 is an enlarged plan view of the area A of FIG. 6.

Referring to FIG. 8, the through holes HL may be provided at the folding portion FP of the digitizer DGT. Each of the through holes HL may have a first width WD1 in the first direction DR1. For example, the first width WD1 may be greater than or equal to about 0.1 millimeters and less than or equal to about 0.5 millimeters. Each of the through holes HL may have a second width WD2 in the second direction DR2. For example, the second width WD2 may be greater than or equal to about 4 millimeters and less than or equal to about 10 millimeters.

The through holes HL may include a plurality of first through holes HL1 and a plurality of second through holes HL2. The first through holes HL1 may be spaced apart from each other in the second direction DR2. The first through holes HL1 may be spaced apart from the second through holes HL2 in the first direction DR1. For example, a first separation distance DS1 in the first direction DR1 between the first through holes HL1 and the second through holes HL2 may be greater than or equal to about 0.1 millimeters and less than or equal to about 0.3 millimeters. The second through holes HL2 may be spaced apart from each other in the second direction DR2. A separation distance in the second direction DR2 between the first through holes HL1 and a separation distance in the second direction DR2 between the second through holes HL2 may be equal to each other. A second separation distance DS2 in the second direction DR2 between the through holes HL adjacent in the second direction DR2 may be greater than or equal to about 0.1 millimeter and less than or equal to about 0.3 millimeter.

The second through holes HL2 may be shifted from the first through holes HL1 in the second direction DR2 by a predetermined distance. The predetermined distance shifted in the second direction DR2 may be less than half of the second width WD2. Accordingly, the folding portion FP excluding the through holes HL may have a slit shape of a grid pattern. In other words, the folding portion FP, excluding the through holes HL, may have a grid pattern with a slit-like shape. In an embodiment, each of the through holes HL may include an end portion HL-ED with a predetermined curvature.

The first non-folding portion NFP1 and the second non-folding portion (NFP2, see FIG. 6) may have substantially the same or symmetrical shapes. Accordingly, hereinafter, the following description will focus on the first non-folding portion NFP1. The description of the first non-folding portion NFP1 may be used in place of the description of the second non-folding portion NFP2.

The first extension sensing lines EL1 may be disposed at the first non-folding portion NFP1 and the folding portion FP. Each of the first extension sensing lines EL1 may extend between the through holes HL in the folding portion FP. In an embodiment, each of the first extension sensing lines EL may extend in a curved path along the edges of the through holes HL in the folding portion FP.

In an embodiment, each of the first extension sensing lines EL1 may include a patterned portion PP in the folding portion FP. The patterned portion PP may be disposed between the through holes HL. Specifically, the patterned portion PP may include a first pattern P1, a second pattern P2, a curved pattern RP, and a third pattern P3.

Each of the first pattern P1 and the second pattern P2 may extend in the second direction DR2. The first pattern P1 and the second pattern P2 may be spaced apart from each other in the first direction DR1 with a corresponding through hole HL interposed therebetween.

The curved pattern RP may connect the first pattern P1 and the second pattern P2. The curved pattern RP may have a predetermined curvature. In an embodiment, the curved pattern RP may have a shape corresponding to a shape of the end portion HL-ED of each of the through holes HL.

The third pattern P3 may extend in the first direction DR1 from the second pattern P2. The third pattern P3 may be connected to the first pattern P1 of another patterned portion PP included in the same first extension sensing line EL1. As illustrated in FIG. 8, the third pattern P3 may have the shape of a straight line extending in the first direction DR1; however, the present disclosure is not limited to this configuration. For example, the third pattern P3 may have a predetermined curvature, such as the curved pattern RP. In this case, the third pattern P3 may have a shape corresponding to the shape of the end portion HL-ED of each of the through holes HL.

The digitizer DGT may further include guide patterns GDP disposed in the folding portion FP. Each of the guide patterns GDP may surround at least a part of each of the through holes HL in a plan view. Each of the guide patterns GDP may be disposed between the corresponding through hole HL and the first extension sensing lines EL1 in a plan view.

In an embodiment, as illustrated in FIG. 8, the guide pattern GDP may entirely surround each of the through holes HL in a plan view. In other words, the guide pattern GDP may have a shape that corresponds to a shape of the edge of the corresponding through hole HL.

The guide pattern GDP may be disposed between the through holes HL and the patterned portion PP, which extends in a curved path along the edge of the through hole HL.

When the digitizer DGT is folded at the folding portion FP, stress may concentrate on the curved pattern RP with a predetermined curvature. This concentrated stress, can lead to cracks in the curved pattern RP of each of the first extension sensing lines EL1.

To prevent cracks from forming the curved pattern RP, the digitizer DGT according to an embodiment of the present disclosure may include the guide pattern GDP that surrounds at least a part of each of the through holes HL in a plan view. Accordingly, when the digitizer DGT is folded at the folding portion FP, the stress is distributed to the guide pattern GDP. By distributing this stress to the guide pattern GDP, the stress on the curved pattern RP may be reduced, thereby minimizing the risk of cracks in the curved pattern RP of each of the first extension sensing lines EL1.

Figure 9:
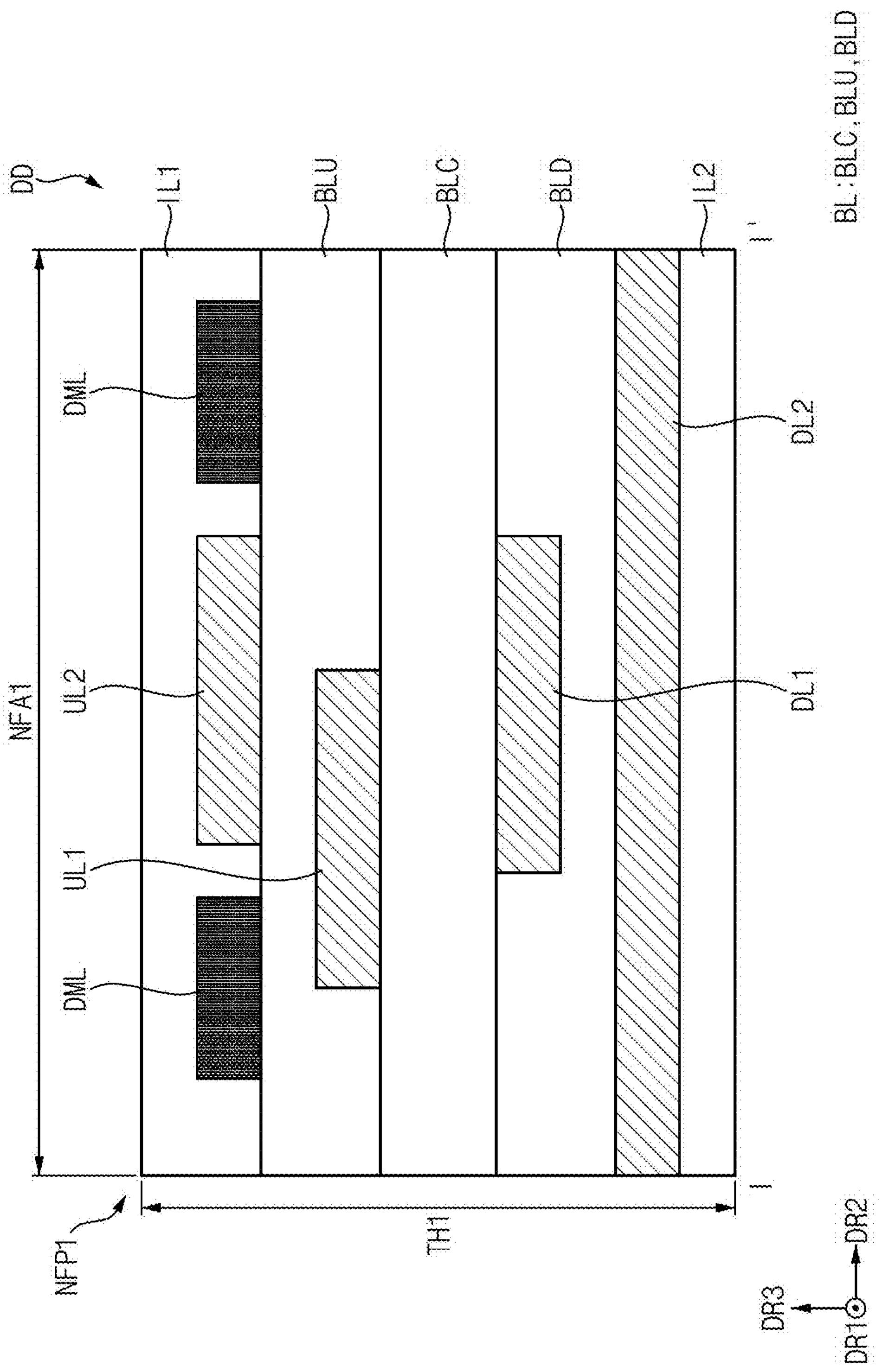
FIG. 9 is a cross-sectional view taken along the line I-I' of FIG. 8.
Figure 10:
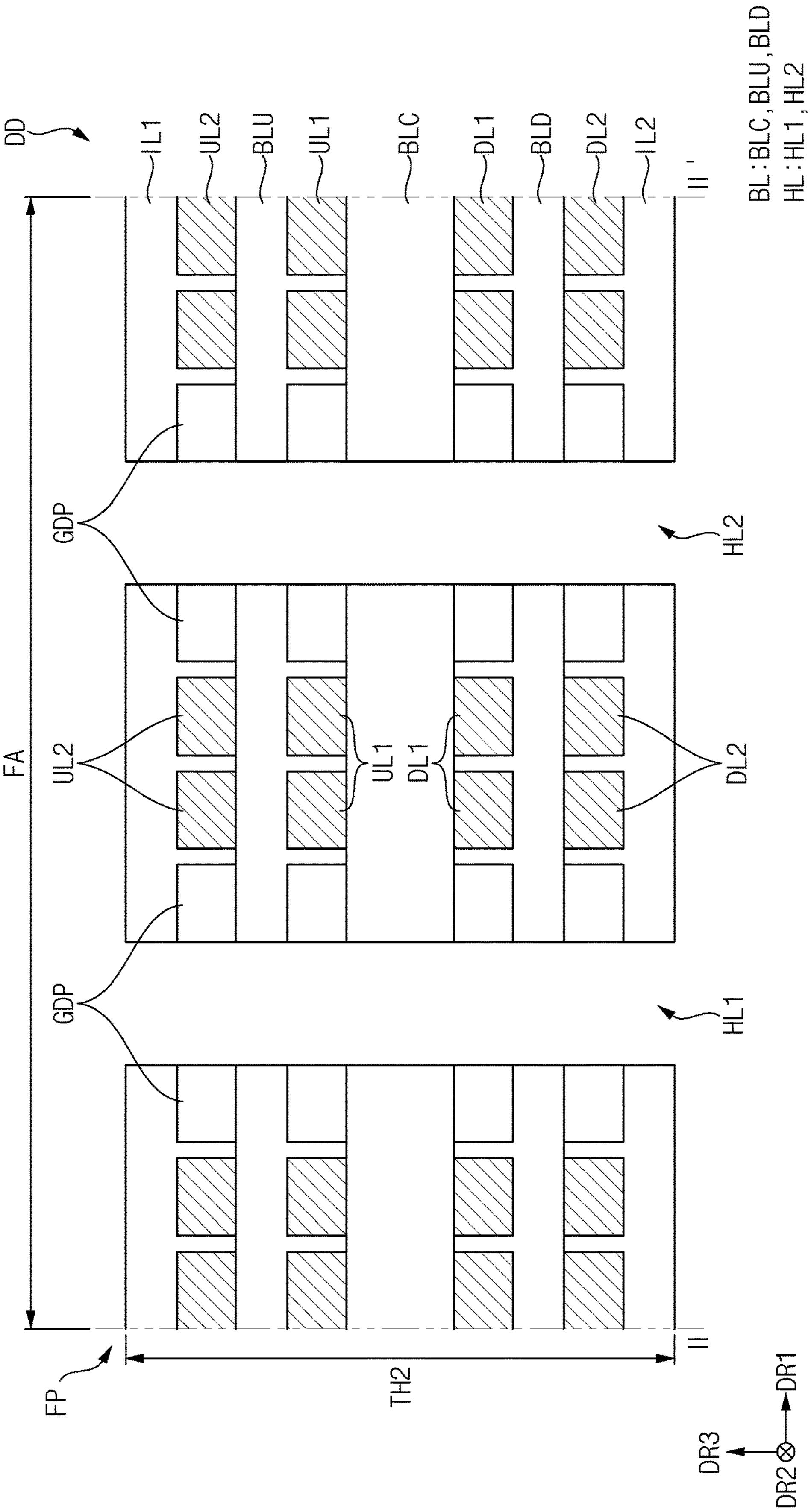
FIG. 10 is a cross-sectional view taken along the line II-II' of FIG. 8.
Figure 11:
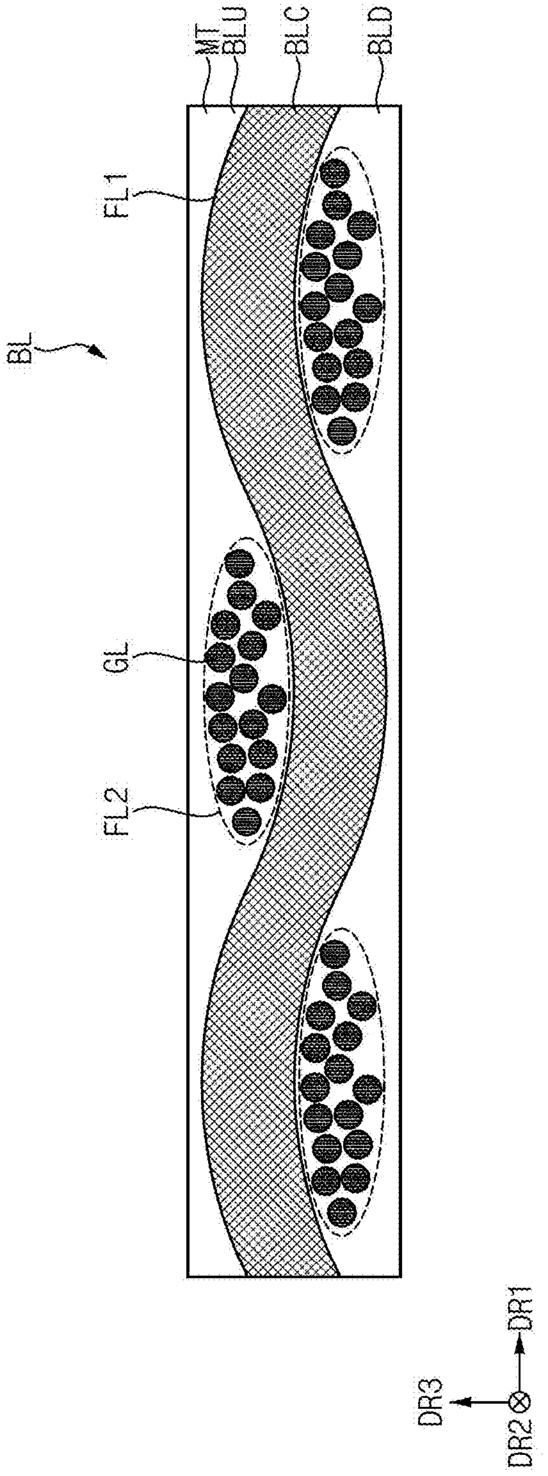
FIG. 11 is a cross-sectional view illustrating a base layer included in the digitizer of FIG. 6.
Figure 12:
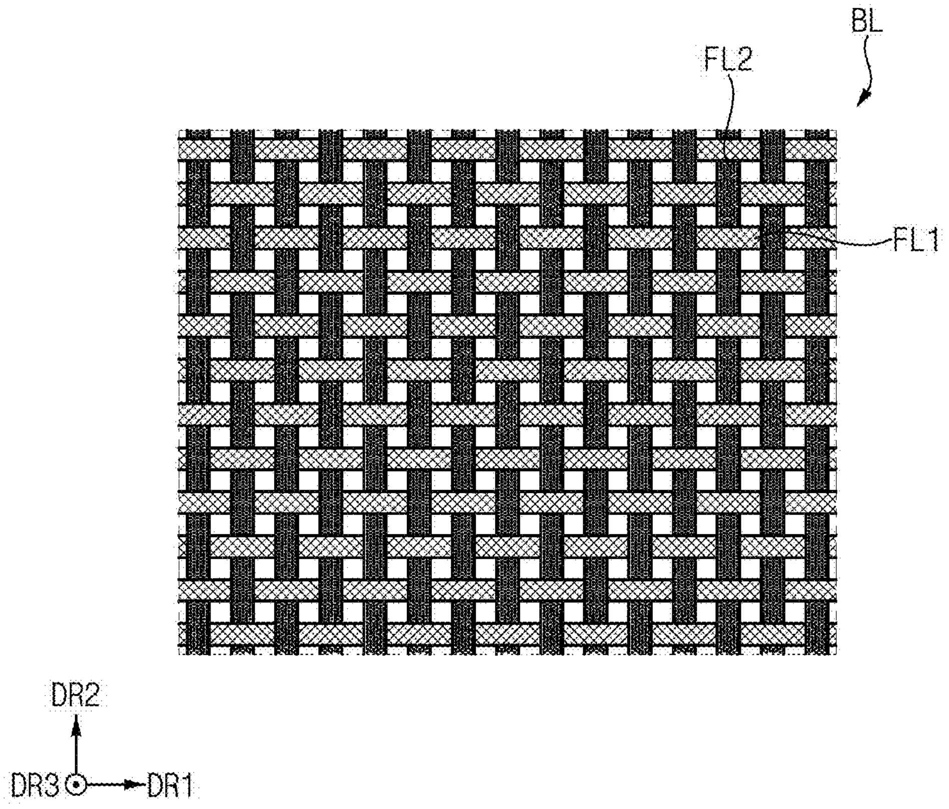
FIG. 12 is a plan view illustrating the base layer of FIG. 11.

FIG. 9 is a cross-sectional view taken along the line I-I' of FIG. 8. For example, FIG. 9 is a cross-sectional view illustrating the first non-folding portion NFP1 of the digitizer DGT. FIG. 10 is a cross-sectional view taken along the line II-II' of FIG. 8. For example, FIG. 10 is a cross-sectional view illustrating the folding portion FP of the digitizer DGT. FIG. 11 is a cross-sectional view illustrating a base layer included in the digitizer of FIG. 6. FIG. 12 is a plan view illustrating the base layer of FIG. 11.

Referring to FIGS. 8, 9, and 10, the digitizer DGT according to an embodiment of the present disclosure may include a base layer BL, a first upper sensing line UL1, a second upper sensing line UL2, a plurality of dummy lines DML, a first insulating layer IL1, a first lower sensing line DL1, a second lower sensing line DL2, the plurality of guide patterns GDP, and a second insulating layer IL2. The base layer BL may include a middle base layer BLC, an upper base layer BLU, and a lower base layer BLD. The through holes HL provided in the folding portion FP may penetrate the base layer BL, the first insulating layer IL1, and the second insulating layer IL2 in the thickness direction (or in the third direction DR3).

The first upper sensing line UL1 may be disposed on the middle base layer BLC in the first non-folding portion NFP1 and the folding portion FP. Specifically, the first upper sensing line UL1 may be disposed on an upper surface of the middle base layer BLC at the first non-folding portion NFP1 and the folding portion FP. The first upper sensing line UL1 may correspond to the first extension sensing line EL1 of FIG. 6.

The upper base layer BLU may be disposed on the middle base layer BLC in the first non-folding portion NFP1 and the folding portion FP. The upper base layer BLU may cover the first upper sensing line UL1.

The second upper sensing line UL2 may be disposed on the upper base layer BLU in the first non-folding portion NFP1 and the folding portion FP. Specifically, the second upper sensing line UL2 may be disposed on an upper surface of the upper base layer BLU in the first non-folding portion NFP1 and the folding portion FP. The second upper sensing line UL2 may correspond to the first extension sensing line EL1 of FIG. 6. The second upper sensing line UL2 may overlap with the first upper sensing line UL1 in the third direction DR3.

The dummy lines DML may be disposed on the upper base layer BLU in the first non-folding portion NFP1. Specifically, the dummy lines DML may be disposed on the upper surface of the upper base layer BLU in the first non-folding portion NFP1. The dummy lines DML may not be disposed in the folding portion FP. The dummy lines DML may be spaced apart from the second upper sensing line UL2 in the second direction DR2. The dummy lines DML may compensate for a step formed by the second upper sensing line UL2.

The first insulating layer IL1 may be disposed on the upper base layer BLU in the first non-folding portion NFP1 and the folding portion FP. The first insulating layer IL1 may cover the second upper sensing line UL2 and the dummy lines DML in the first non-folding portion NFP1.

The first lower sensing line DL1 may be disposed under the middle base layer BLC in the first non-folding portion NFP1 and the folding portion FP. Specifically, the first lower sensing line DL1 may be disposed on a lower surface of the middle base layer BLC in the first non-folding portion NFP1 and the folding portion FP. The first lower sensing line DL1 may correspond to the second connection sensing line CL2 of FIG. 7. The first lower sensing line DL1 may overlap with the first and second upper sensing lines UL1 and UL2 in the third direction DR3.

The lower base layer BLD may be disposed under the middle base layer BLC in the first non-folding portion NFP1 and the folding portion FP. The lower base layer BLD may cover the first lower sensing line DL1.

The second lower sensing line DL2 may be disposed under the lower base layer BLD in the first non-folding portion NFP1 and the folding portion FP. Specifically, the second lower sensing line DL2 may be disposed on a lower surface of the lower base layer BLD in the first non-folding portion NFP1 and the folding portion FP. The second lower sensing line DL2 may extend in the second direction DR2 in the first non-folding portion NFP1. The second lower sensing line DL2 may correspond to the second extension sensing line EL2 of FIG. 7. The second lower sensing line DL2 may overlap with the first lower sensing ling DL1 and the first and second upper sensing lines UL1 and UL2 in the third direction DR3.

The second insulating layer IL2 may be disposed under the lower base layer BLD in the first non-folding portion NFP1 and the folding portion FP. The second insulating layer IL2 may cover the second lower sensing line DL2.

Each of the guide patterns GDP may surround at least a part of each of the through holes HL in a plan view. In other words, the guide pattern GDP may be adjacent to each of the through holes HL in a cross-sectional view. The guide pattern GDP may be positioned closer to each of the through holes HL than the upper sensing lines UL1 and UL2 and the lower sensing lines DL1 and DL2.

The guide patterns GDP may be disposed on the base layer BL in the folding portion FP. The guide patterns GDP may not be disposed in the first non-folding portion NFP1. The guide patterns GDP may be disposed on at least one of the middle base layer BLC, the upper base layer BLU, and the lower base layer BLD in the folding portion FP. For example, as illustrated in FIG. 10, the guide patterns GDP may be disposed on each of the upper surface of the middle base layer BLC, the lower surface of the middle base layer BLC, the upper surface of the upper base layer BLU, and the lower surface of the lower base layer BLD. However, the present disclosure is not limited thereto.

The guide patterns GDP may be disposed on the upper surface of the middle base layer BLC in the folding portion FP. In this case, the first upper sensing line UL1 may be disposed between the guide patterns GDP in the folding portion FP. The upper base layer BLU may cover the first upper sensing line UL1 and the guide patterns GDP in the folding portion FP.

The guide patterns GDP may be disposed on the upper surface of the upper base layer BLU in the folding portion FP. In this case, the second upper sensing line UL2 may be disposed between the guide patterns GDP in the folding portion FP. The first insulating layer IL1 may cover the second upper sensing line UL2 and the guide patterns GDP at the folding portion FP.

The guide patterns GDP may be disposed on the lower surface of the middle base layer BLC in the folding portion FP. In this case, the first lower sensing line DL1 may be disposed between the guide patterns GDP in the folding portion FP. The lower base layer BLD may cover the first lower sensing line DL1 and the guide patterns GDP at the folding portion FP.

The guide patterns GDP may be disposed on the lower surface of the lower base layer BLD in the folding portion FP. In this case, the second lower sensing line DL2 may be disposed between the guide patterns GDP in the folding portion FP. The second insulating layer IL2 may cover the second lower sensing line DL2 and the guide patterns GDP at the folding portion FP.

Referring further to FIGS. 11 and 12, the base layer BL may include a matrix MT including a filler, along with a plurality of fiber lines FL1 and FL2 disposed in the matrix MT in a woven pattern in a plan view. Each of the middle base layer BLC, the upper base layer BLU, and the lower base layer BLD may be a prepreg layer impregnated with the matrix MT and including the fiber lines FL1 and FL2 extending in one direction.

The matrix MT may include a synthetic resin such as epoxy, polyester, polyamide, polycarbonate, polypropylene, polybutylene, vinyl ester, etc. These may be used alone or in combination with each other.

The fillers included in the matrix MT may include silica, barium sulphate, sintered talc, barium titanate, titanium oxide, clay, alumina, mica, boehmite, zinc borate, zinc tinate, etc. They may be used alone or in combination with each other.

The fiber lines FL1 and FL2 may be disposed in the matrix MT. For example, each of the fiber lines FL1 and FL2 may be a glass fiber-reinforced plastic (GFRP). Each of the fiber lines FL1 and FL2 may be provided as a bundle of glass fibers GL. A diameter of a strand of the glass fiber GL included in one fiber line may be greater than or equal to about 3 micrometers and less than or equal to about 10 micrometers. However, the diameter of the glass fiber GL is not limited thereto.

As illustrated in FIG. 12, the fiber lines FL1 and FL2 may be alternately arranged along the first direction DR1 and the second direction DR2 in a woven pattern in a plan view. For example, the middle base layer BLC may include first fiber lines FL1 extending in the first direction DR1, and each of the upper base layer BLU and the lower base layer BLD may include second fiber lines FL2 extending in the second direction DR2.

In an embodiment, the first insulating layer IL1, the second insulating layer IL2, the middle base layer BLC, the upper base layer BLU, and the lower base layer BLD may include the same material as each other. In other words, each of the first insulating layer IL1 and the second insulating layer IL2 may include the matrix MT including a filler, and the fiber lines FL1 and FL2 disposed in the matrix MT and extending in a single direction.

Each of the first insulating layer IL1, the second insulating layer IL2, the middle base layer BLC, the upper base layer BLU, and the lower base layer BLD may include the matrix MT, and the matrix MT may include a synthetic resin, such as epoxy, polyester, polyamide, etc. For example, each of the first insulating layer IL1, the second insulating layer IL2, the middle base layer BLC, the upper base layer BLU, and the lower base layer BLD may be referred to as a resin layer.

When densities of the compositions impregnated in the plurality of resin layers differ between the first non-folding portion NFP1 and the folding portion FP, a first thickness TH1 of the first non-folding portion NFP1 and a second thickness TH2 of the folding portion FP may also differ.

To achieve a substantially equal first thickness TH1 for the first non-folding portion NFP1 and second thickness TH2 for the folding portion FP, the dummy lines DML may be disposed only on the upper base layer BLU at the first non-folding portion NFP1, while the guide pattern GP may be disposed on at least one of the middle base layer BLC, the upper base layer BLU, and the lower base layer BLD at the folding portion FP. This configuration allows the densities of the compositions impregnated in the base layers BLC, BLU, and BLD and the insulating layers IL1 and IL2 to be adjusted, making them substantially the same at the first non-folding portion NFP1 and the folding portion FP. A detailed description thereof will be described below with reference to FIGS. 17 and 18.

Figure 13:
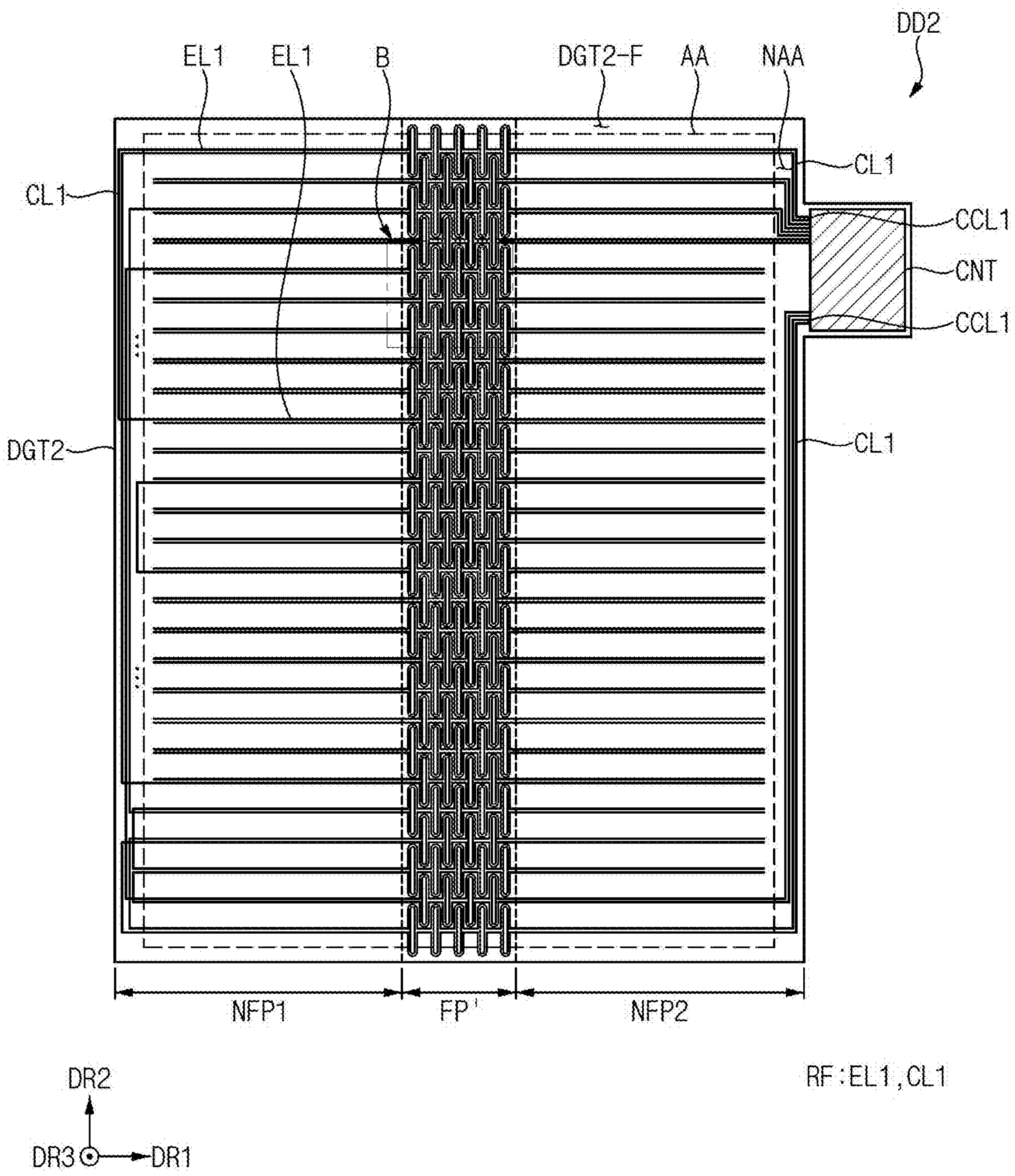
FIG. 13 is a plan view illustrating a digitizer according to another embodiment of the present disclosure.
Figure 14:
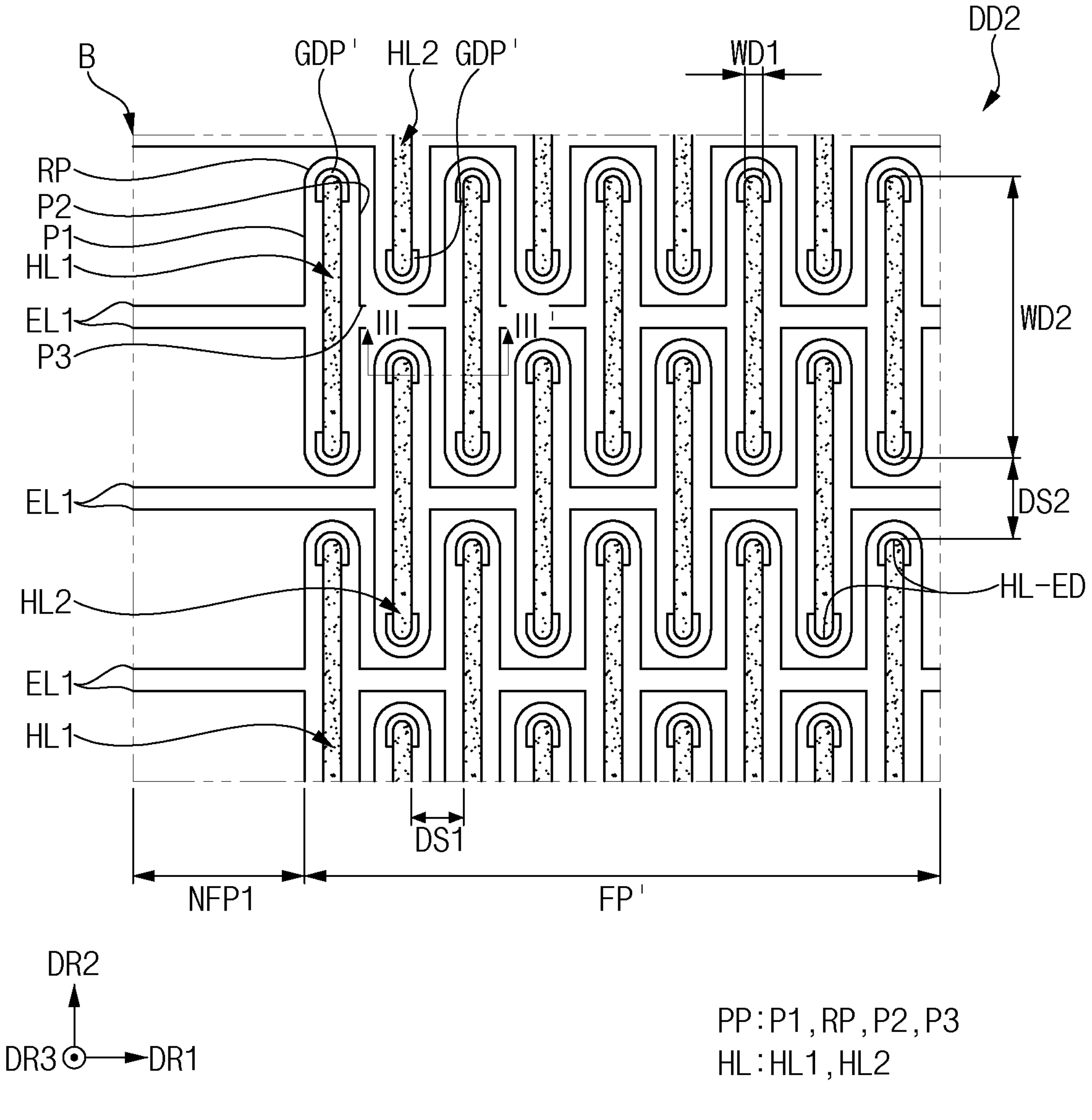
FIG. 14 is an enlarged plan view of the area B of FIG. 13.
Figure 15:
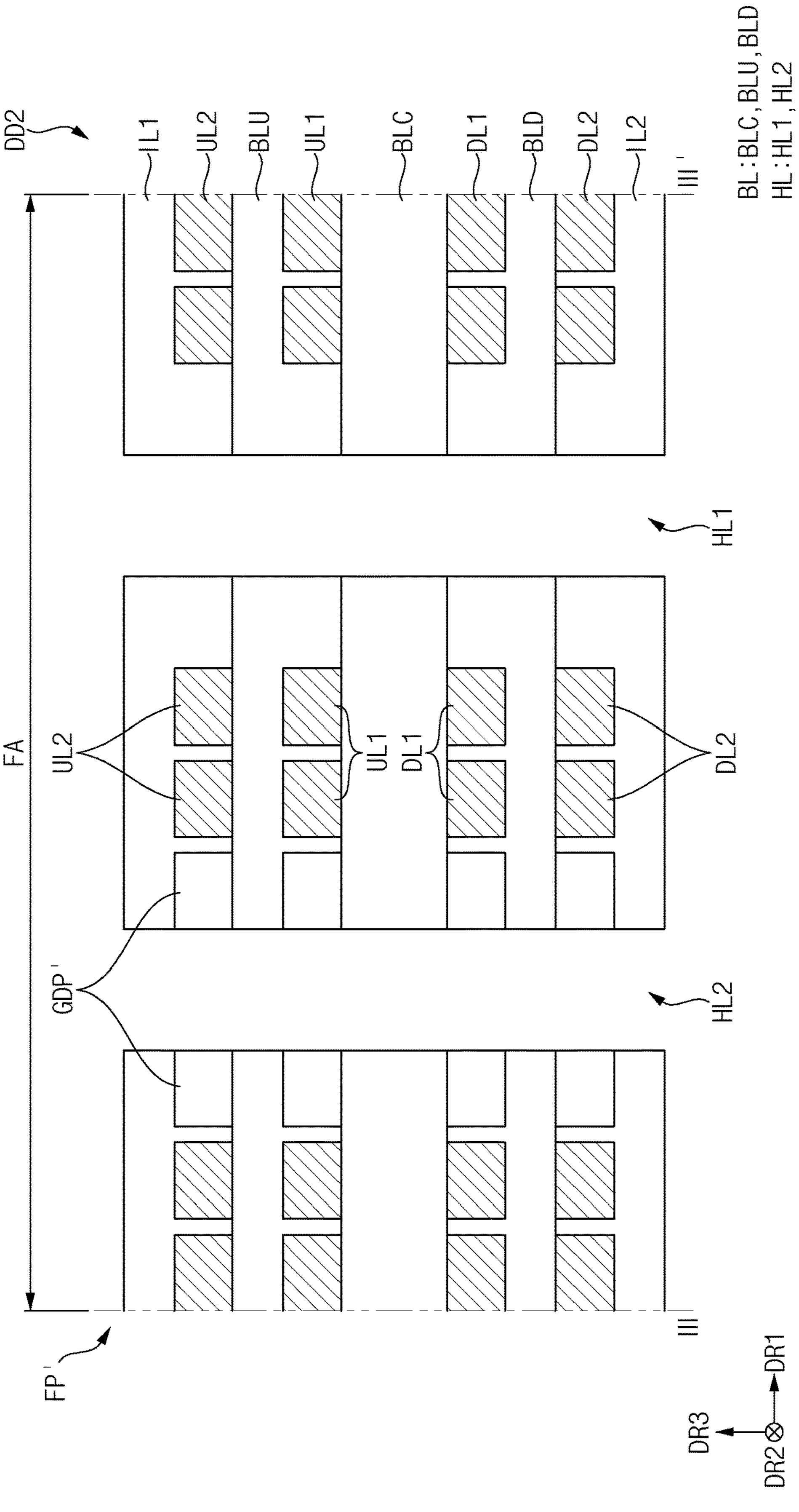
FIG. 15 is a cross-sectional view taken along the line III-III' of FIG. 14.

FIG. 13 is a plan view illustrating a digitizer according to another embodiment of the present disclosure. FIG. 14 is an enlarged plan view of the area B of FIG. 13. FIG. 15 is a cross-sectional view taken along the line III-III' of FIG. 14.

Referring to FIGS. 13, 14, and 15, a digitizer DGT2 according to another embodiment of the present disclosure may include the plurality of first sensing coils RF, the plurality of first connector connection lines CCL1, the connector CNT, and a plurality of guide patterns GDP'. Each of the first sensing coils RF may include the first extension sensing lines EL1 and the first connection sensing lines CL1. The first extension sensing lines EL1 may include the first upper sensing line UL1 and the second upper sensing line UL2 disposed on the first upper sensing line UL1.

The digitizer DGT2 may be substantially the same as the digitizer DGT described above with reference to FIGS. 6 to 12, except that each of the guide patterns GDP' has a shape corresponding to the shape of the curved pattern RP and surrounds the end portion HL-ED of the through hole HL in a plan view. Therefore, redundant descriptions of the digitizer DGT from FIGS. 6 to 12 may be omitted or summarized in the following sections.

The plurality of through holes HL may be provided at a folding portion FP' of the digitizer DGT2. The through holes HL may include the plurality of first through holes HL1 and the plurality of second through holes HL2. The first through holes HL1 may be spaced apart from the second through holes HL2 in the first direction DR1. The second through holes HL2 may be shifted from the first through holes HL1 in the second direction DR2 by a predetermined distance. In an embodiment, each of the through holes HL may include the end portion HL-ED having a predetermined curvature.

Each of the first extension sensing lines EL1 may include the patterned portion PP at the folding portion FP'. The patterned portion PP may include the first pattern P1, the second pattern P2, the curved pattern RP, and the third pattern P3.

Each of the first pattern P1 and the second pattern P2 may extend in the second direction DR2. The first pattern P1 and the second pattern P2 may be spaced apart from each other in the first direction DR1 with a corresponding through hole HL interposed therebetween. For example, each of the first pattern P1 and the second pattern P2 may be a straight pattern.

The curved pattern RP may connect the first pattern P1 and the second pattern P2. The curved pattern RP may have a predetermined curvature. In an embodiment, the curved pattern RP may have a shape corresponding to a shape of the end portion HL-ED of each of the through holes HL.

The guide patterns GDP' may be disposed at the folding portion FP'. Each of the guide patterns GDP' may surround at least a portion of each of the through holes HL in a plan view. In an embodiment, as illustrated in FIG. 14, the guide patterns GDP' may surround the end portion HL-ED of each of the through holes HL. For example, the guide patterns GDP' may have a shape corresponding to the shape of the end portion HL-ED of the through hole HL and a shape of the curved pattern RP. In other words, the guide pattern GDP' may be disposed only between the end portion HL-ED of the through hole HL and the curved pattern RP, and may not be disposed between the through hole HL and the straight pattern (e.g., the first pattern P1 or the second pattern P2).

When the digitizer DGT2 is folded at the folding portion FP', stress may be concentrated at the curved pattern RP having a predetermined curvature. The digitizer DGT2 according to another embodiment of the present disclosure may include the guide pattern GDP' surrounding the end portion HL-ED of the through hole HL in a plan view. In other words, the guide pattern GDP' may be disposed only at an area where the stress is concentrated. Accordingly, when the digitizer DGT2 is folded at the folding portion FP', the stress may be distributed to the guide pattern GDP'. As the stress is distributed to the guide pattern GDP', a stress applied to the curved pattern RP may be reduced. Accordingly, cracks may not occur at the curved pattern RP of each of the first extension sensing lines EL1.

FIGS. 16, 17, 18, 19, and 20 are views illustrating a method of manufacturing a digitizer according to an embodiment of the present disclosure.

The method of manufacturing the digitizer described below with reference to FIGS. 16, 17, 18, 19, and 20 may be a method of manufacturing the digitizer DGT described above with reference to FIGS. 6 to 12. Hereinafter, redundant descriptions of the digitizer DGT described above with reference to FIGS. 6 to 12 may be omitted or summarized in the following sections.

Referring to FIGS. 16, 17, 18, 19, and 20, the method of manufacturing the digitizer according to an embodiment of the present disclosure may include forming a plurality of dummy patterns DMP on the base layer BL at the folding portion FP, forming a sensing line disposed between the dummy patterns DMP in a plan view on the base layer BL at the folding portion FP, and forming the plurality of through holes HL and the guide pattern GDP surrounding at least a portion of each of the through holes HL by removing a portion of the dummy patterns DMP and a portion of the base layer BL.

Figure 16:
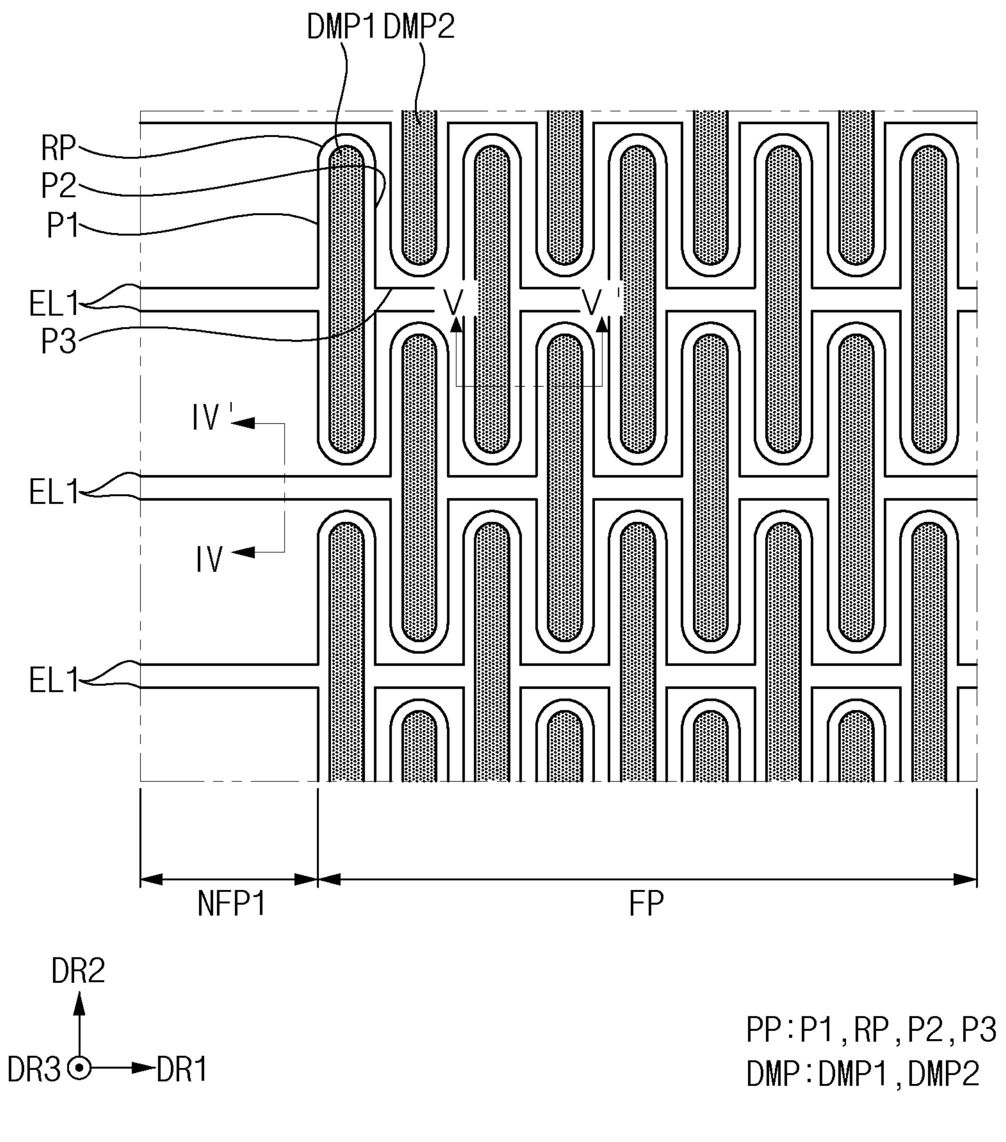
FIGS. 16, 17, 18, 19, and 20 are views illustrating a method of manufacturing a digitizer according to an embodiment of the present disclosure.
Figure 17:
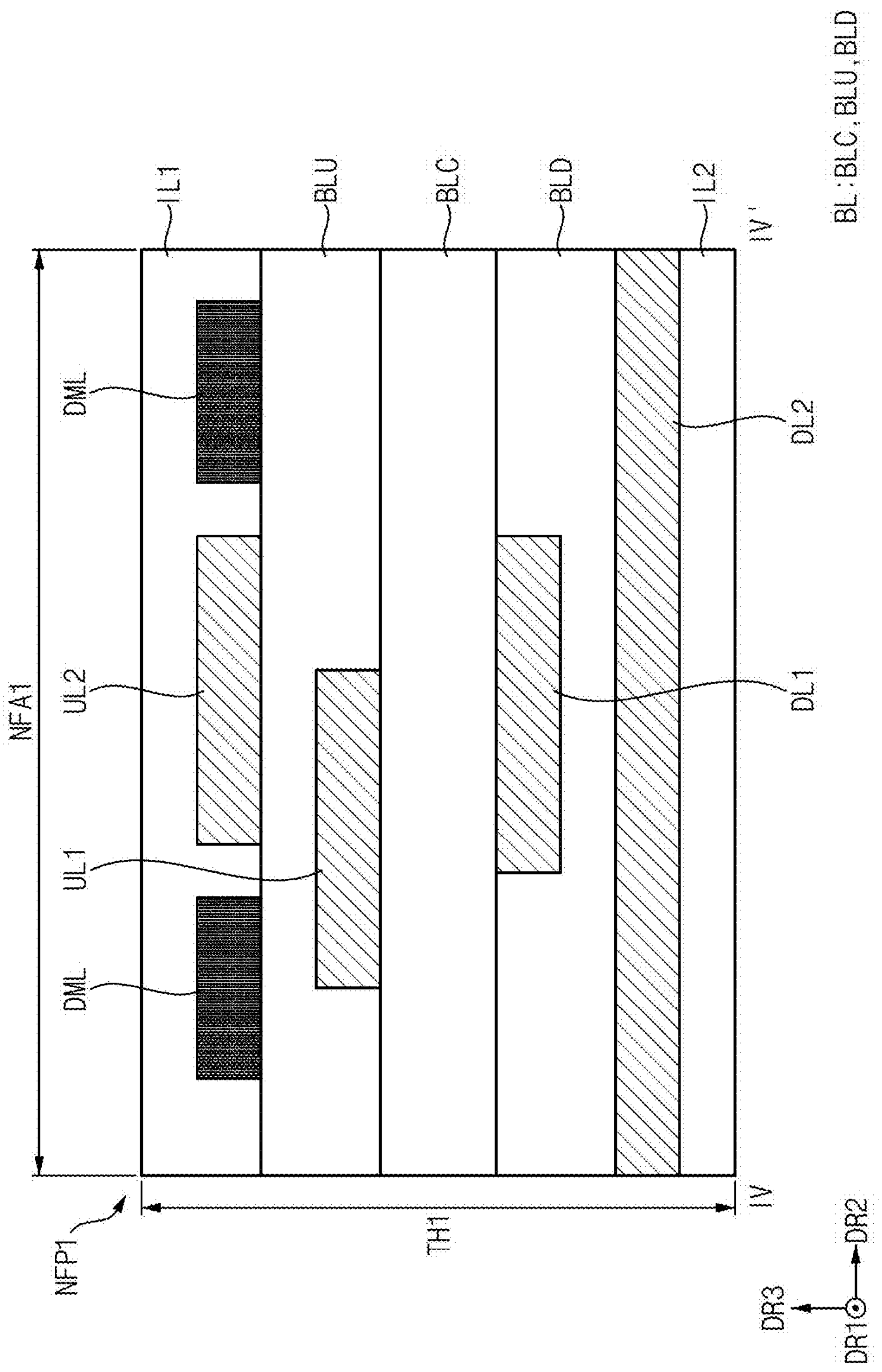
Figure 18:
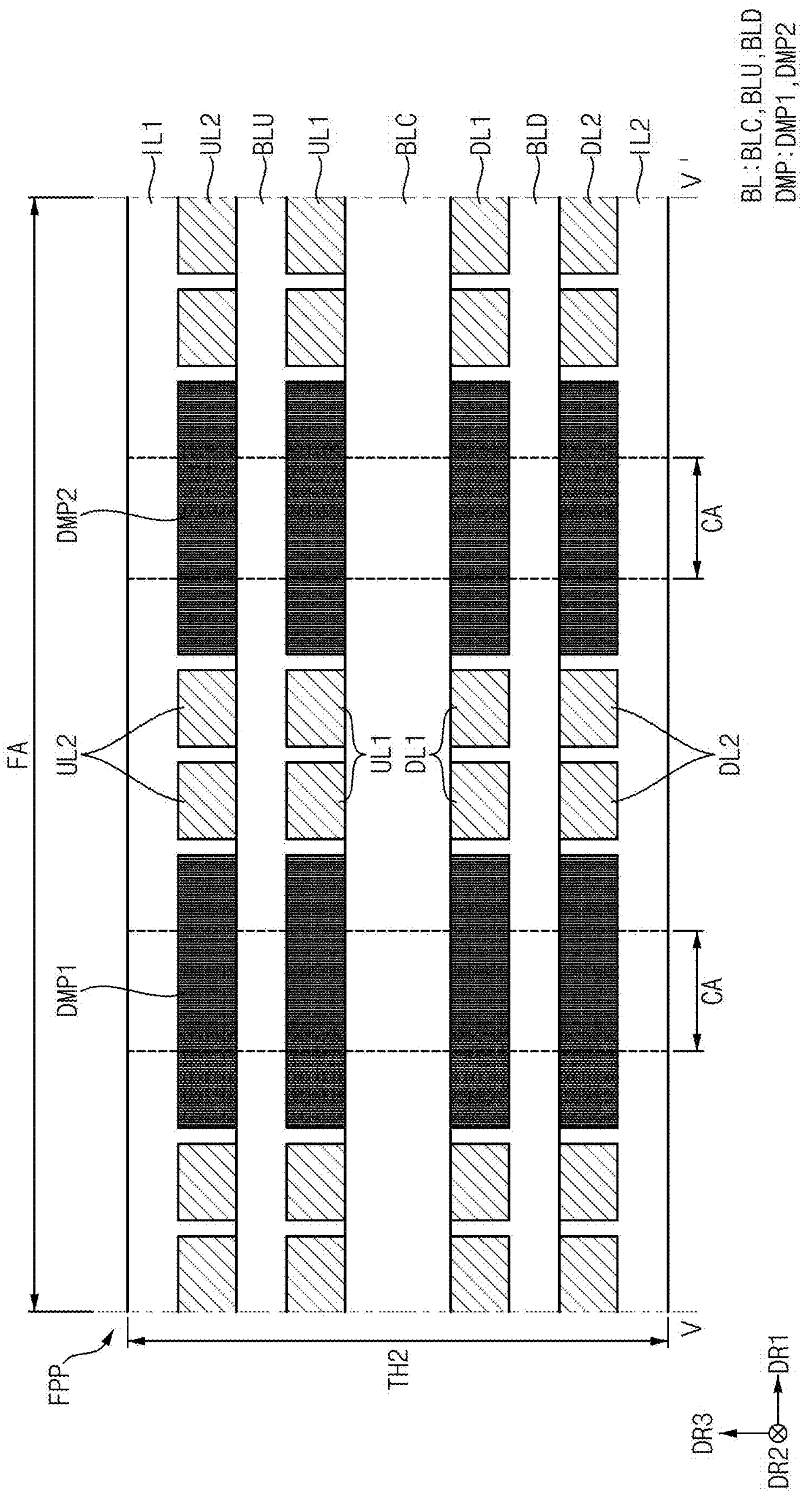

As illustrated in FIGS. 16, 17, and 18, the base layer BL including the first non-folding portion NFP1, the second non-folding portion (NFP2, see FIG. 6), and the folding portion FP may be provided.

The first non-folding portion NFP1 may be spaced apart from the second non-folding portion (NFP2, see FIG. 6) in the first direction DR1 with the folding portion FP interposed therebetween. Since the first non-folding portion NFP1 and the second non-folding portion (NFP2, see FIG. 6) may have substantially the same or symmetrical shapes, the following description will focus on the first non-folding portion NFP1.

As illustrated in FIG. 16, the plurality of dummy patterns DMP may be formed on the base layer BL at the folding portion FP. The dummy patterns DMP may include a plurality of first dummy patterns DMP1 and a plurality of second dummy patterns DMP2. The first dummy patterns DMP1 may be spaced apart from each other in the second direction DR2. The first dummy patterns DMP1 may be spaced apart from the second dummy patterns DMP2 in the first direction DR1. The second dummy patterns DMP2 may be spaced apart from each other in the second direction DR2. The second dummy patterns DMP2 may be shifted from the first dummy patterns DMP1 in the second direction DR2 by a predetermined distance.

At the folding portion FP, a plurality of sensing lines disposed between the dummy patterns DMP in a plan view may be formed on the base layer BL. For example, the first extension sensing lines EL1 disposed between the dummy patterns DMP in a plan view may be formed. Each of the first extension sensing lines EL1 may extend in the first direction DR1 to be curved along edges of the dummy patterns DMP.

Specifically, as illustrated in FIGS. 17 and 18, the first upper sensing line UL1 may be formed on the upper surface of the middle base layer BLC at the first non-folding portion NFP1. The first upper sensing line UL1 may correspond to the first extension sensing line EL1. In addition, the dummy patterns DMP and the first upper sensing line UL1 disposed between the dummy patterns DMP may be formed on the upper surface of the middle base layer BLC at the folding portion FP.

The upper base layer BLU may be formed on the middle base layer BLC at the first non-folding portion NFP1 and the folding portion FP. The upper base layer BLU may impregnate the first upper sensing line UL1 at the first non-folding portion NFP1. In other words, the upper base layer BLU may embed the first upper sensing line UL1 in the first non-folding portion NFP1. Accordingly, the upper base layer BLU may cover the first upper sensing line UL1 at the first non-folding portion NFP1. In addition, the upper base layer BLU may impregnate the dummy patterns DMP and the first upper sensing line UL1 at the folding portion FP. In addition, the upper base layer BLU may embed the dummy patterns DMP and the first upper sensing line UL1 in the folding portion FP. Accordingly, the upper base layer BLU may cover the dummy patterns DMP and the first upper sensing line UL1 at the folding portion FP.

The second upper sensing line UL2 and the dummy lines DML spaced apart from the second upper sensing line UL2 in the second direction DR2 may be formed on the upper surface of the upper base layer BLU at the first non-folding portion NFP1. The second upper sensing line UL2 may correspond to the first extension sensing line EL1. In addition, the dummy patterns DMP and the second upper sensing line UL2 disposed between the dummy patterns DMP may be formed on the upper surface of the upper base layer BLU at the folding portion FP.

The first insulating layer IL1 may be formed on the upper base layer BLU at the first non-folding portion NFP1 and the folding portion FP. The first insulating layer IL1 may impregnate the second upper sensing line UL2 and the dummy lines DML at the first non-folding portion NFP1. In other words, the first insulating layer IL1 may embed the second upper sensing line UL2 and the dummy lines DML in the first non-folding portion NFP1. Accordingly, the first insulating layer IL1 may cover the second upper sensing line UL2 and the dummy lines DML at the first non-folding portion NFP1. In addition, the first insulating layer IL1 may impregnate the second upper sensing lines UL2 and the dummy patterns DMP at the folding portion FP. In other words, the first insulating layer IL1 may embed the second upper sensing lines UL2 and the dummy patterns DMP in the folding portion FP. Accordingly, the first insulating layer IL1 may cover the second upper sensing line UL2 and the dummy patterns DMP at the folding portion FP.

The first lower sensing line DL1 may be formed on the lower surface of the middle base layer BLC at the first non-folding portion NFP1. The first lower sensing line DL1 may correspond to the second connection sensing line CL2 of FIG. 7. In addition, the dummy patterns DMP and the first lower sensing line DL1 disposed between the dummy patterns DMP may be formed on the lower surface of the middle base layer BLC at the folding portion FP.

The lower base layer BLD may be formed under the middle base layer BLC at the first non-folding portion NFP1 and the folding portion FP. The lower base layer BLD may impregnate (e.g., embed) the first lower sensing line DL1 at the first non-folding portion NFP1. Accordingly, the lower base layer BLD may cover the first lower sensing line DL1 at the first non-folding portion NFP1. In addition, the lower base layer BLD may impregnate (e.g., embed) the dummy patterns DMP and the first lower sensing line DL1 at the folding portion FP. Accordingly, the lower base layer BLD may cover the dummy patterns DMP and the first lower sensing line DL1 at the folding portion FP.

The second lower sensing line DL2 may be formed on the lower surface of the lower base layer BLD at the first non-folding portion NFP1. The second lower sensing line DL2 may correspond to the second extension sensing line EL2 of FIG. 7. The dummy patterns DMP and the second lower sensing line DL2 disposed between the dummy patterns DMP may be formed on the lower surface of the lower base layer BLD at the folding portion FP.

The second insulating layer IL2 may be formed under the lower base layer BLD at the first non-folding portion NFP1 and the folding portion FP. The second insulating layer IL2 may impregnate (e.g., embed) the second lower sensing line DL2 at the first non-folding portion NFP1. Accordingly, the second insulating layer IL2 may cover the second lower sensing line DL2 at the first non-folding portion NFP1. In addition, the second insulating layer IL2 may impregnate (e.g., embed) the dummy patterns DMP and the second lower sensing line DL2 at the folding portion FP. Accordingly, the second insulating layer IL2 may cover the dummy patterns DMP and the second lower sensing line DL2 at the folding portion FP.

Each of the first insulating layer IL1, the second insulating layer IL2, the middle base layer BLC, the upper base layer BLU, and the lower base layer BLD may include a synthetic resin. For example, each of the first insulating layer IL1, the second insulating layer IL2, the middle base layer BLC, the upper base layer BLU, and the lower base layer BLD may be referred to as a resin layer.

To make the first thickness TH1 of the first non-folding portion NFP1 and the second thickness TH2 of the folding portion FP substantially equal to each other, the dummy lines DML may be disposed only on the upper base layer BLU at the first non-folding portion NFP1, and the dummy patterns DMP may be disposed on at least one of the middle base layer BLC, the upper base layer BLU, and the lower base layer BLD at the folding portion FP.

Accordingly, the densities of the compositions impregnated into the plurality of resin layers BLC, BLU, BLD, IL1, and IL2 may be adjusted to be substantially the same at the first non-folding portion NFP1 and the folding portion FP.

For example, the density of first components (e.g., the first and second upper sensing lines UL1 and UL2, the dummy lines DML, and the first and second lower sensing lines DL1 and DL2) impregnated in the resin layers at the first non-folding portion NFP1 may be equal to the density of second components (e.g., the first and second upper sensing lines UL1 and UL2, the dummy patterns DMP, and the first and second lower sensing lines DL1 and DL2) impregnated in the resin layers at the folding portion FP.

In this case, the thickness of individual resin layers may differ between the first non-folding portion NFP1 and the folding portion FP, but the total thicknesses of all the resin layers BLC, BLU, BLD, IL1, and IL2 may be substantially the same as each other at the first non-folding portion NFP1 and the folding portion FP.

Figure 19:
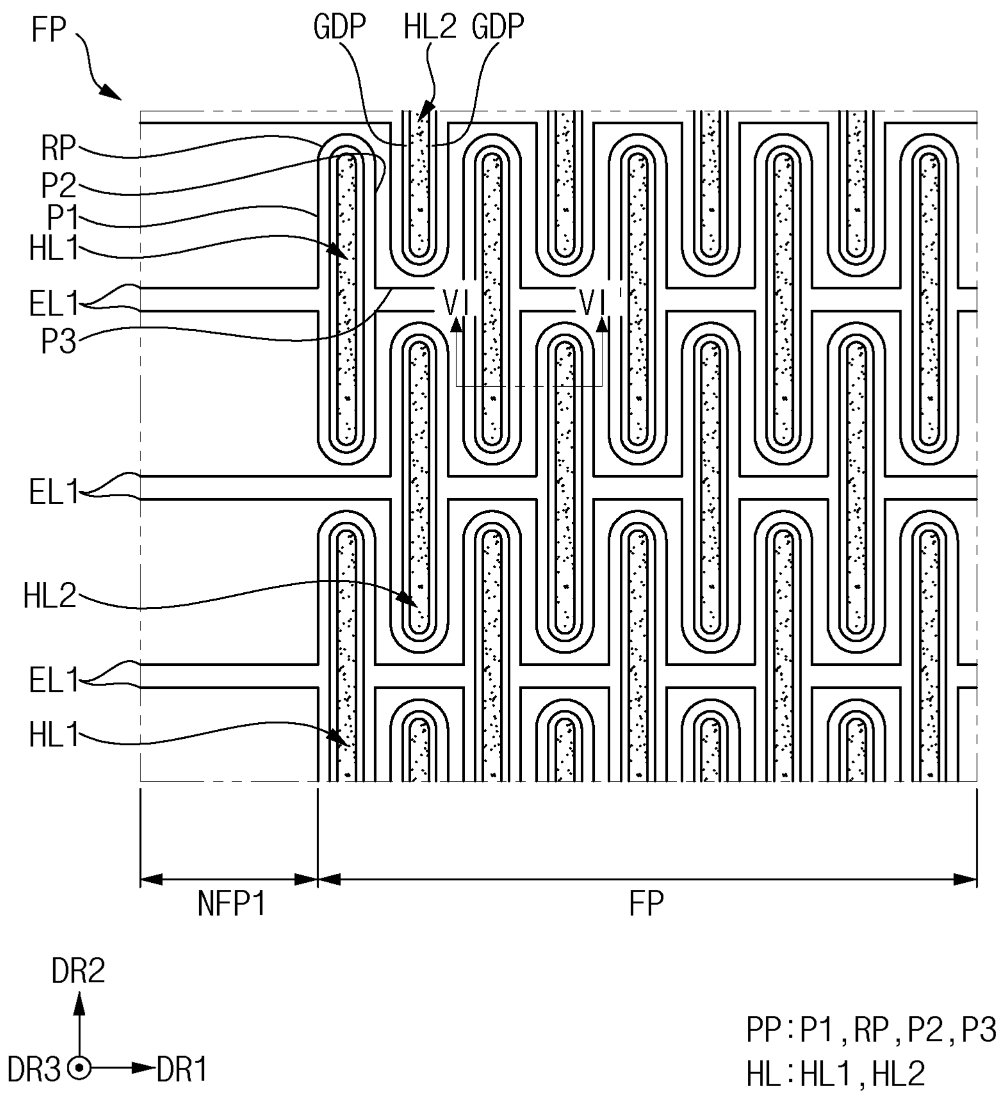
Figure 20:
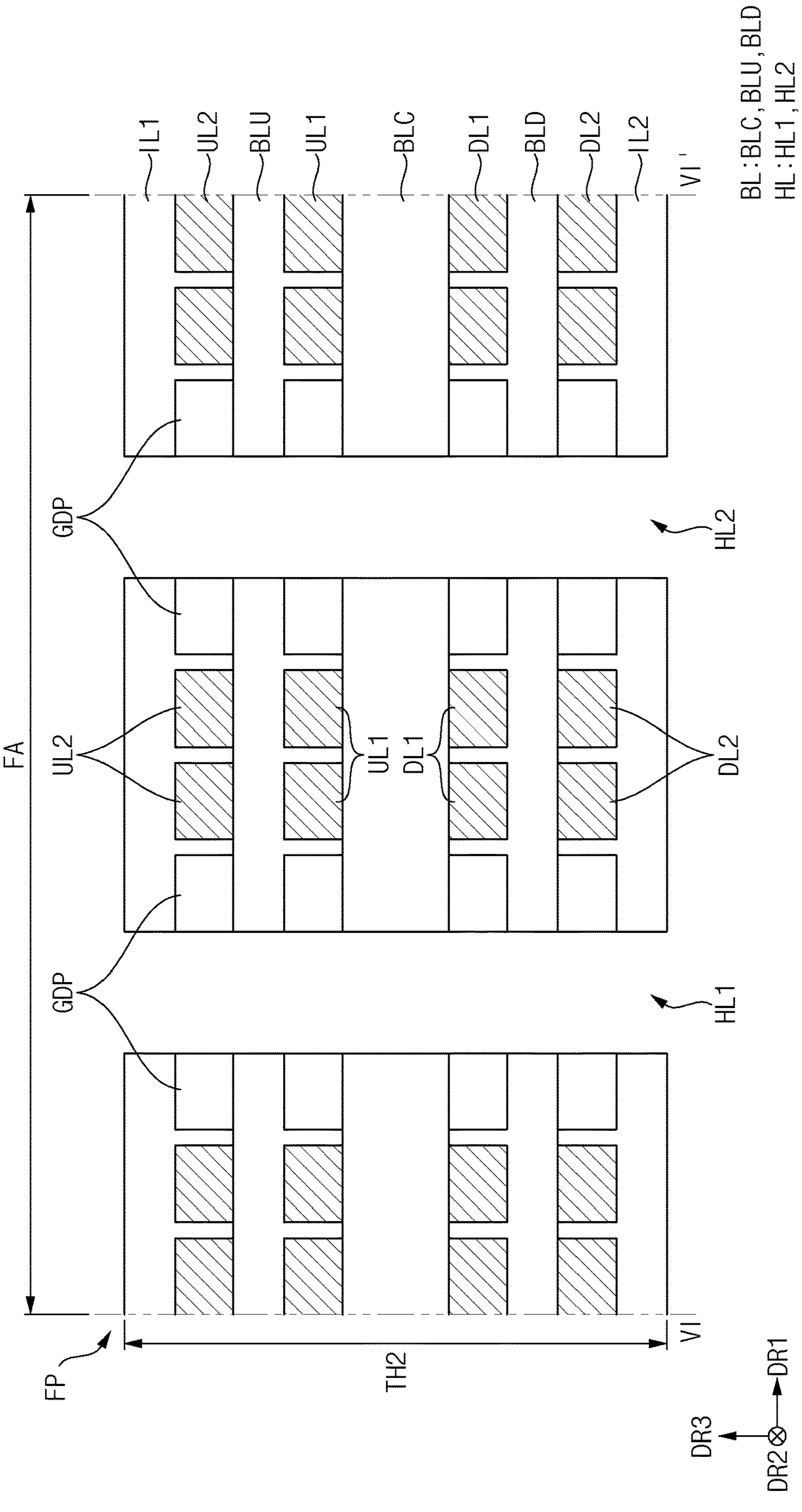

As illustrated in FIGS. 19 and 20, the plurality of through holes HL may be formed by removing a portion of the dummy patterns DMP and a portion of the base layer BL.

Specifically, the portion of each of the dummy patterns DMP and the portion of the base layer BL that overlap a cutting area CA may be removed. In a plan view, the cutting area CA may have a shape corresponding to a shape of each of the dummy patterns DMP. In a plan view, an area of the cutting area CA may be smaller than an area of each of the dummy patterns DMP.

Accordingly, the through holes HL that penetrate the base layer BL, the first insulating layer IL1, and the second insulating layer IL2 in the thickness direction may be formed. In addition, the remaining portions of each of the dummy patterns DMP may form the guide pattern GDP. The guide pattern GDP may entirely surround each of the through holes HL in a plan view.

Figure 21:
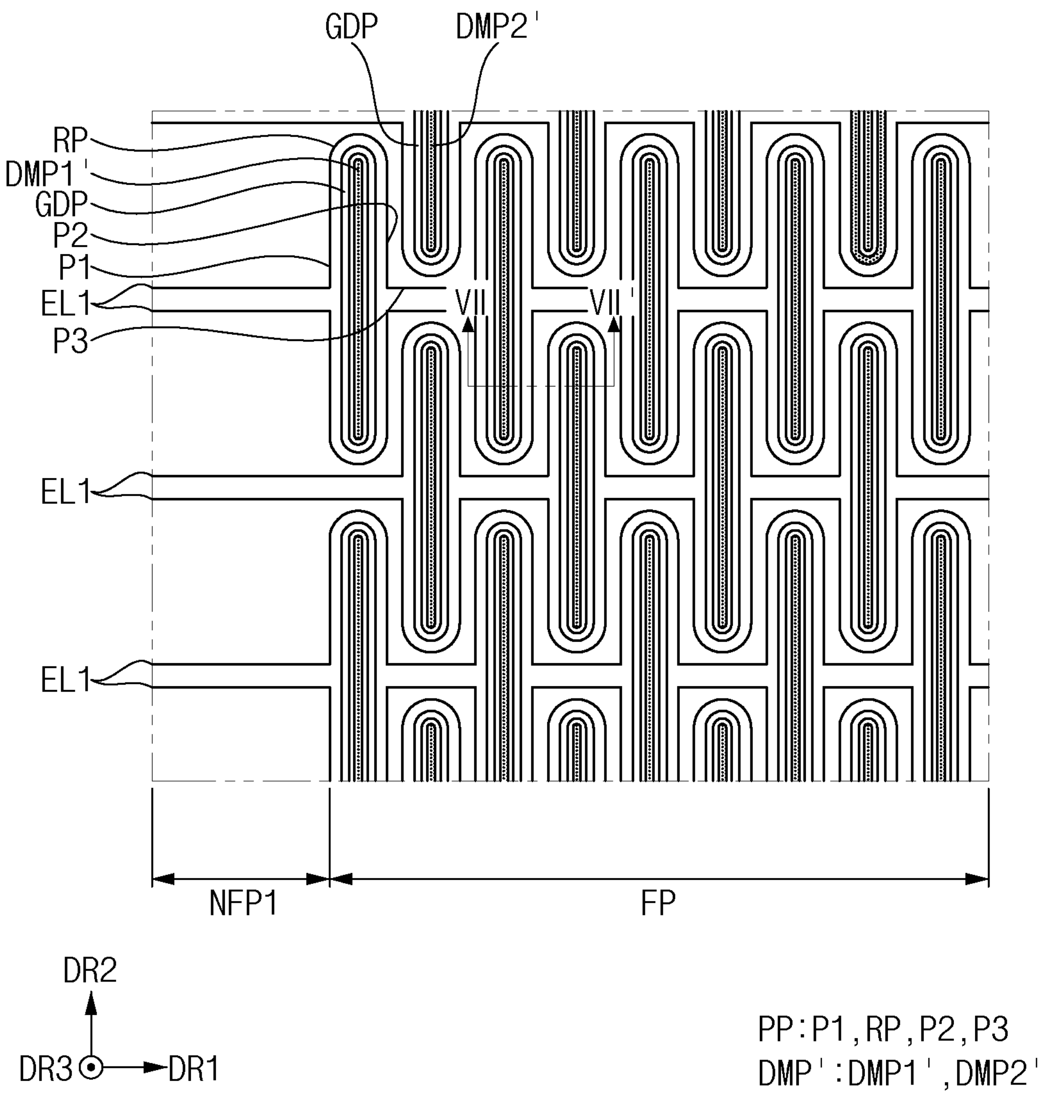
FIGS. 21, 22, and 23 are views illustrating a method of manufacturing a digitizer according to another embodiment of the present disclosure.
Figure 22:
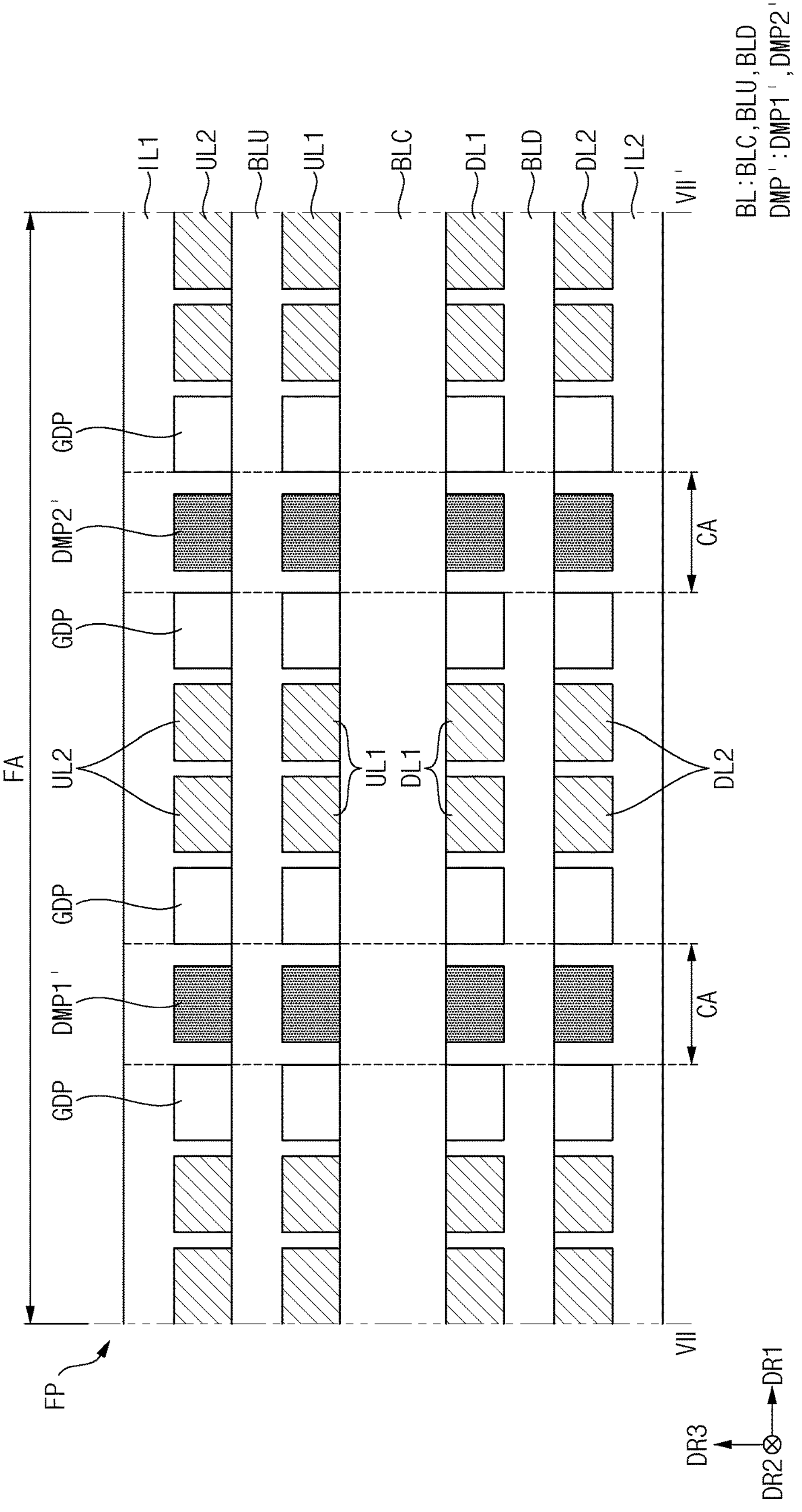
Figure 23:
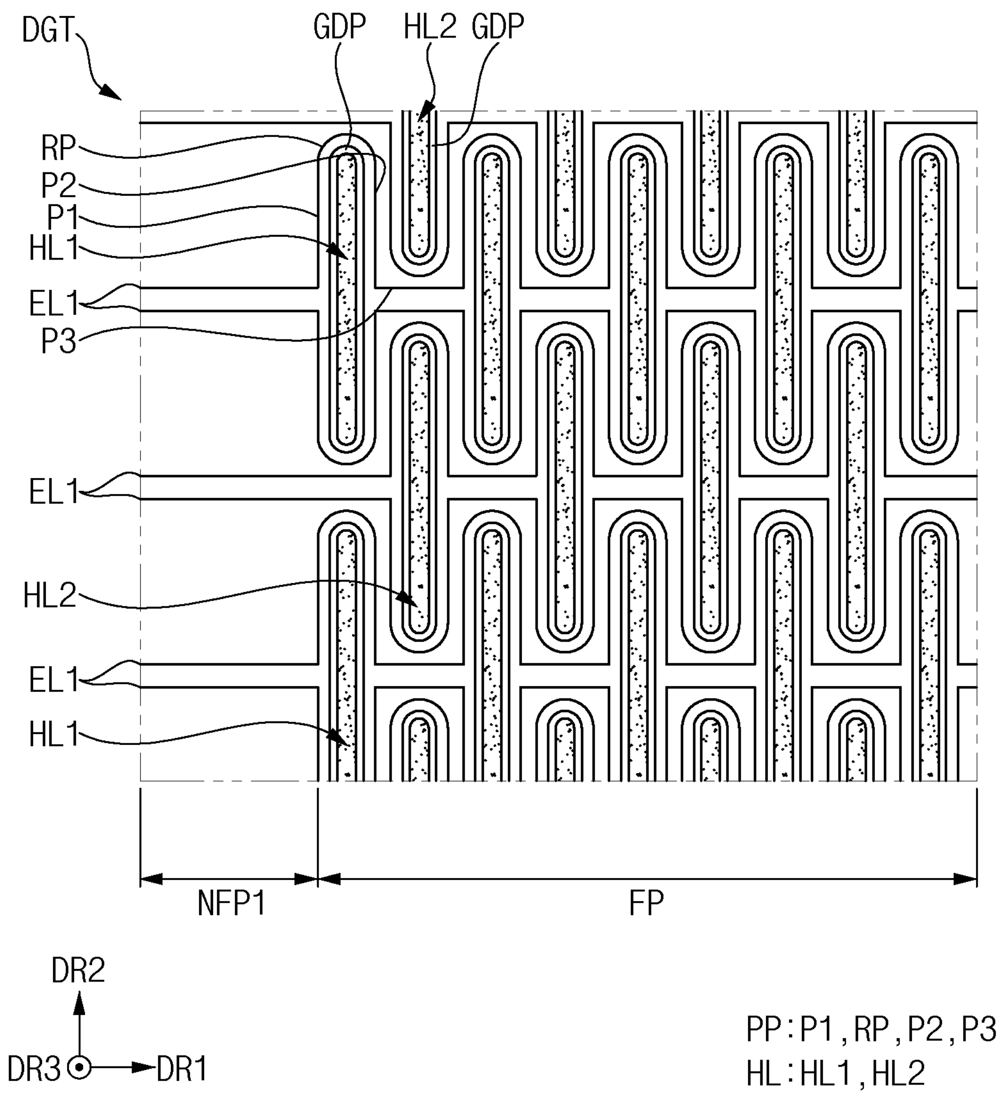

FIGS. 21, 22, and 23 are views illustrating a method of manufacturing a digitizer according to another embodiment of the present disclosure. Hereinafter, redundant descriptions of the method of manufacturing the digitizer described above with reference to FIGS. 16 to 20 may be omitted or summarized in the following sections.

The method of manufacturing the digitizer described below with reference to FIGS. 21, 22, and 23 may be a method of manufacturing the digitizer DGT described above with reference to FIGS. 6 to 12. Hereinafter, redundant descriptions of the digitizer DGT described above with reference to FIGS. 6 to 12 may be omitted or summarized in the following sections.

Referring to FIGS. 21, 22, and 23, the method of manufacturing the digitizer according to another embodiment of the present disclosure may include forming a plurality of dummy patterns DMP' and the guide pattern GDP that surrounds each of the dummy patterns DMP' on the base layer BL at the folding portion FP, forming a sensing line on the base layer BL at the folding portion FP, positioned between the DMP' in a plan view, and forming the plurality of through holes HL, each surrounded by the guide pattern GDP, by removing all of the dummy patterns DMP' and a portion of the base layer BL.

As illustrated in FIG. 21, the dummy patterns DMP' may be formed on the base layer BL at the folding portion FP. The dummy patterns DMP' may include a plurality of first dummy patterns DMP1' and a plurality of second dummy patterns DMP2'. The first dummy patterns DMP1' may be spaced apart from each other in the second direction DR2. The first dummy patterns DMP1' may be spaced apart from the second dummy patterns DMP2' in the first direction DR1. The second dummy patterns DMP2' may be spaced apart from each other in the second direction DR2. The second dummy pattern DMP2' may be shifted from the first dummy pattern DMP1' in the second direction DR2 by a predetermined distance.

The guide pattern GDP, which surrounds each of the dummy patterns DMP' in a plan view, may be formed on the base layer BL at the folding portion FP. The guide patterns GDP may be spaced apart from the dummy patterns DMP'. The guide patterns GDP may have a shape corresponding to a shape of each of the dummy patterns DMP'.

The sensing lines positioned between the dummy patterns DMP' in a plan view may be formed on the base layer BL at the folding portion FP. For example, the first extension sensing line EL1, located between the dummy patterns DMP' in a plan view, may be formed. Each of the first extension sensing lines EL1 may extend in the first direction DR1, curving along edges of the dummy patterns DMP' and an edge of the guide pattern GDP.

As illustrated in FIG. 22, the dummy patterns DMP', the guide pattern GDP, and the first upper sensing line UL1 may be formed on the upper surface of the middle base layer BLC. The dummy patterns DMP', the guide pattern GDP, and the second upper sensing lines UL2 may be formed on the upper surface of the upper base layer BLU. The dummy patterns DMP', the guide pattern GDP, and the first lower sensing line DL1 may be formed on the lower surface of the middle base layer BLC. The dummy patterns DMP', the guide pattern GDP, and the second lower sensing line DL2 may be formed on the lower surface of the lower base layer BLD.

As illustrated in FIG. 23, the through holes HL may be formed by removing all of the dummy patterns DMP' and a portion of the base layer BL. Specifically, all of the dummy patterns DMP' and the portion of the base layer BL that overlap the cutting area CA may be removed. In a plan view, the cutting area CA may have a shape corresponding to a shape of each of the dummy patterns DMP' and the guide pattern GDP. In a plan view, an area of the cutting area CA may be greater than an area of each of the dummy patterns DMP'.

The cutting area CA may overlap an inner side of the guide pattern GDP. In other words, all of the dummy patterns DMP' and the portion of the base layer BL may be removed using the inner side of the guide pattern GDP as a boundary.

Consequently, the through holes HL that penetrate the base layer BL, the first insulating layer IL1, and the second insulating layer IL2 in the thickness direction may be formed, with each through hole HL surrounded by the guide pattern GDP. The guide pattern GDP may entirely encircle each through hole HL in a plan view.

FIGS. 24, 25, 26, and 27 are views illustrating a method of manufacturing a digitizer according to still another embodiment of the present disclosure. Hereinafter, redundant descriptions of the method of manufacturing the digitizer described above with reference to FIGS. 16 to 20 may be omitted or may be summarized.

The method of manufacturing the digitizer described below with reference to FIGS. 24, 25, 26, and 27 may be a method of manufacturing the digitizer DGT2 describes above with reference to FIGS. 13 to 15. Hereinafter, redundant descriptions of the digitizer DGT2 described above with reference to FIGS. 13 to 15 may be omitted or summarized in the following sections.

Referring to FIGS. 24, 25, 26, and 27, the method of manufacturing the digitizer according to still another embodiment of the present disclosure may include forming a plurality of dummy patterns DMP" on the base layer BL at the folding portion FP', forming a sensing line disposed between the dummy patterns DMP" in a plan view on the base layer BL at the folding portion FP', and forming the plurality of through holes HL and the guide pattern GDP' surrounding at least a portion of each of the through holes HL by removing a portion of the dummy patterns DMP" and a portion of the base layer BL.

Figure 24:
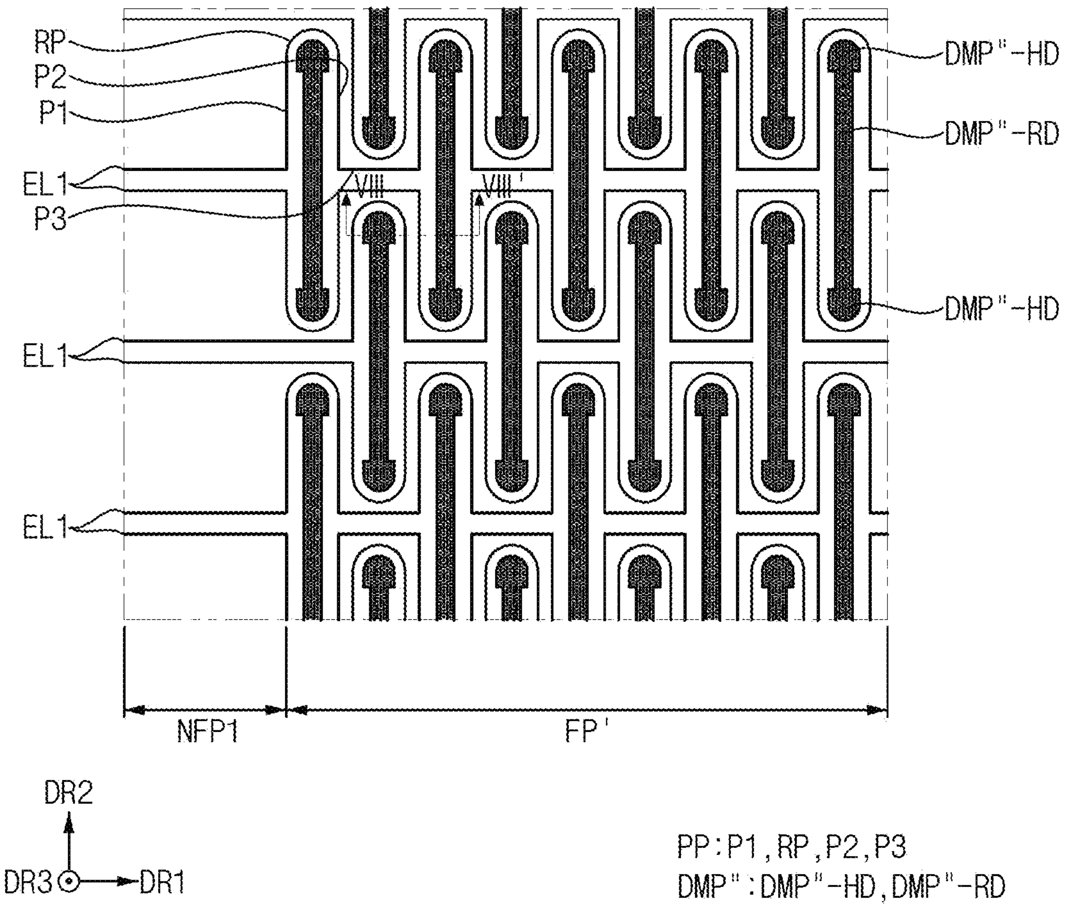
FIGS. 24, 25, 26, and 27 are views illustrating a method of manufacturing a digitizer according to still another embodiment of the present disclosure.
Figure 25:
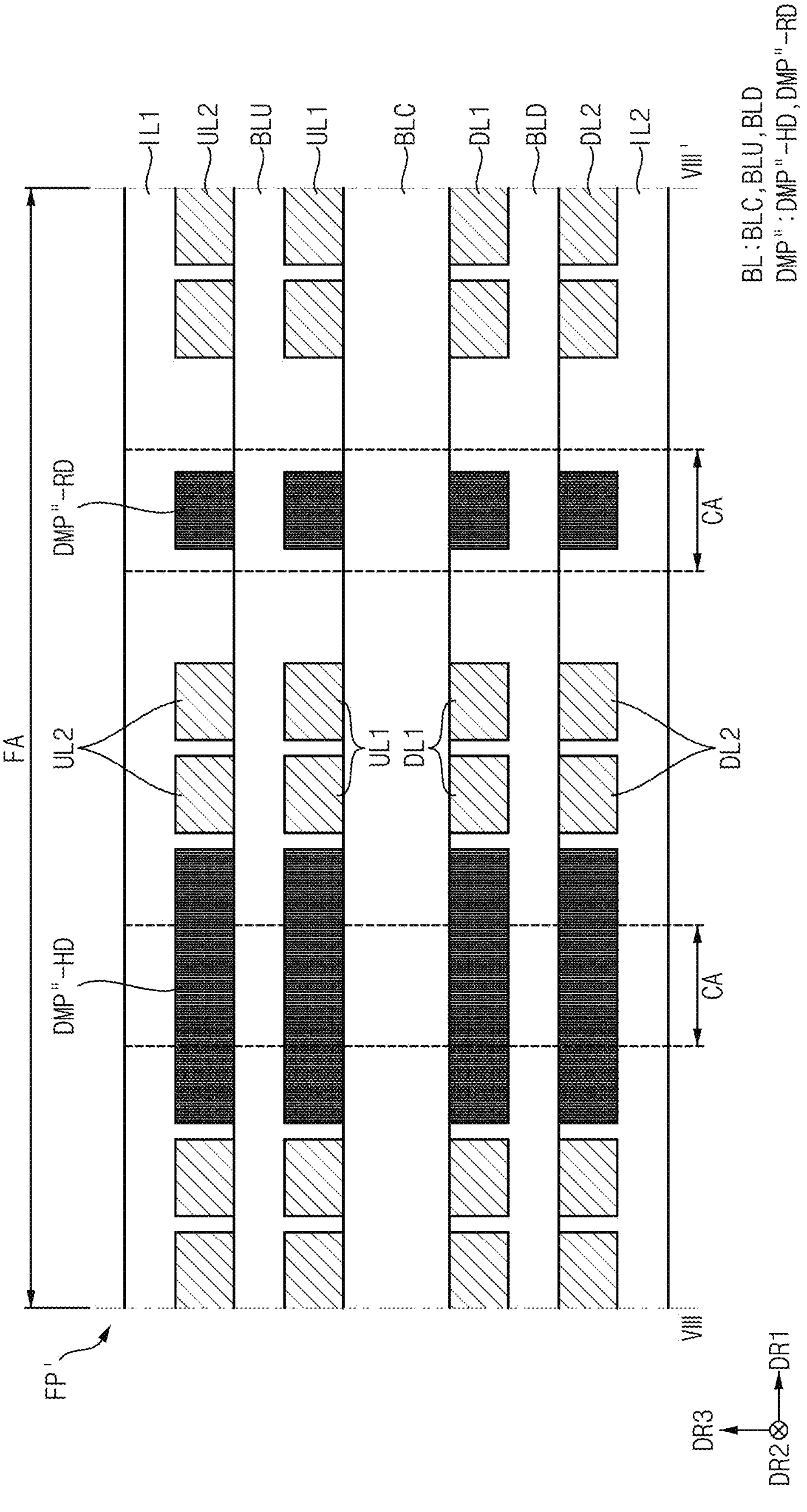

As illustrated in FIGS. 24 and 25, the dummy patterns DMP" may be formed on the base layer BL at the folding portion FP'. Each of the dummy patterns DMP" may include a head portion DMP"-HD and a rod portion DMP"-RD. The head portion DMP"-HD may have a predetermined curvature. The rod portion DMP"-RD may extend from the head portion DMP"-HD in the second direction DR2. The rod portion DMP"-RD may be connected to another head portion DMP"-HD included in the same dummy pattern DMP".

The sensing lines disposed between the dummy patterns DMP" in a plan view may be formed on the base layer BL at the folding portion FP'. For example, the first extension sensing line EL1 disposed between the dummy patterns DMP" in a plan view may be formed. Each of the first extension sensing lines EL1 may extend in the first direction DR1 to be curved along edges of the dummy patterns DMP". Accordingly, each of the first extension sensing lines EL1 may include a curved pattern RP adjacent to the head portion DMP"-HD of each of the dummy patterns DMP" and having a predetermined curvature.

Figure 26:
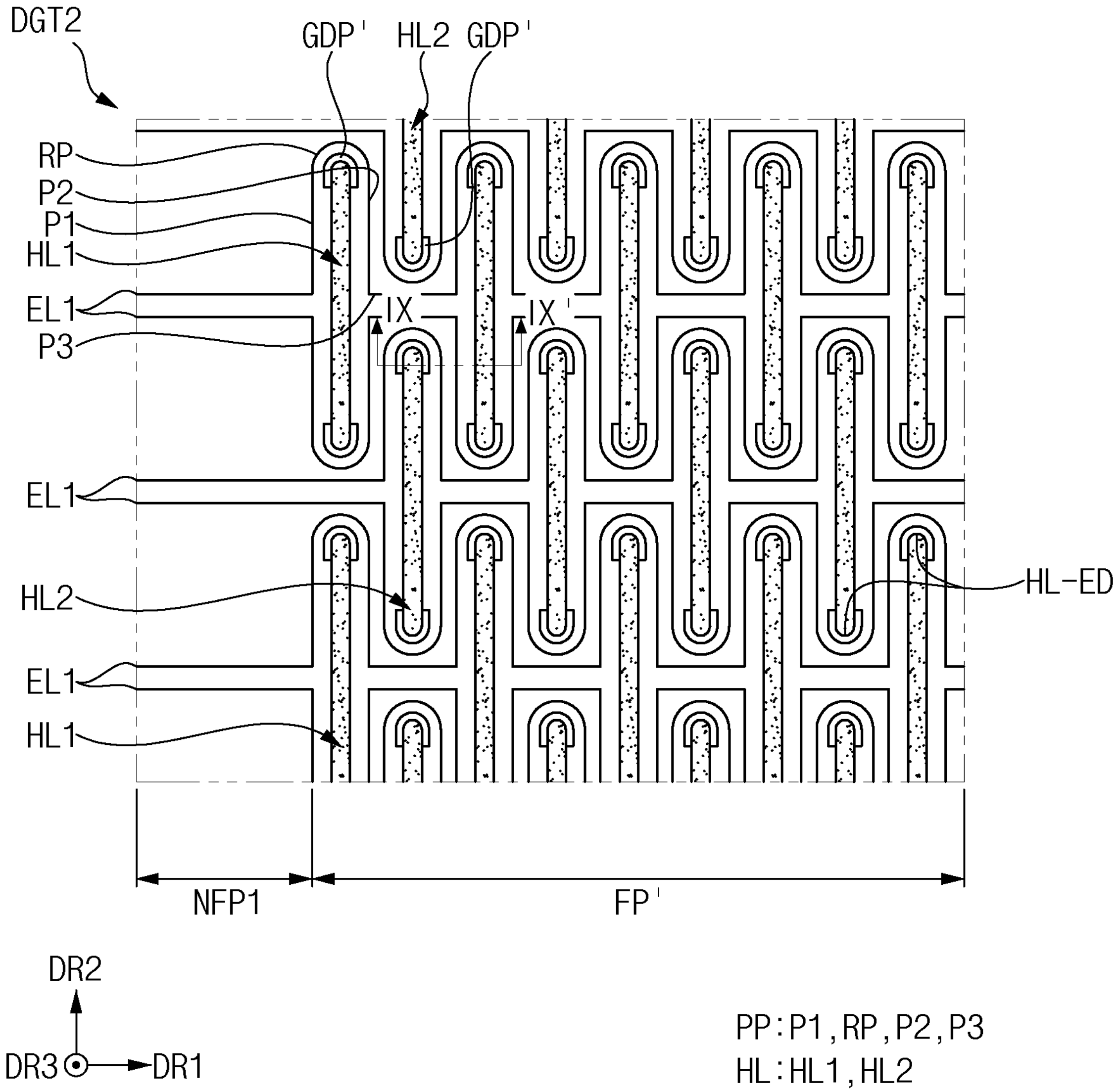
Figure 27:
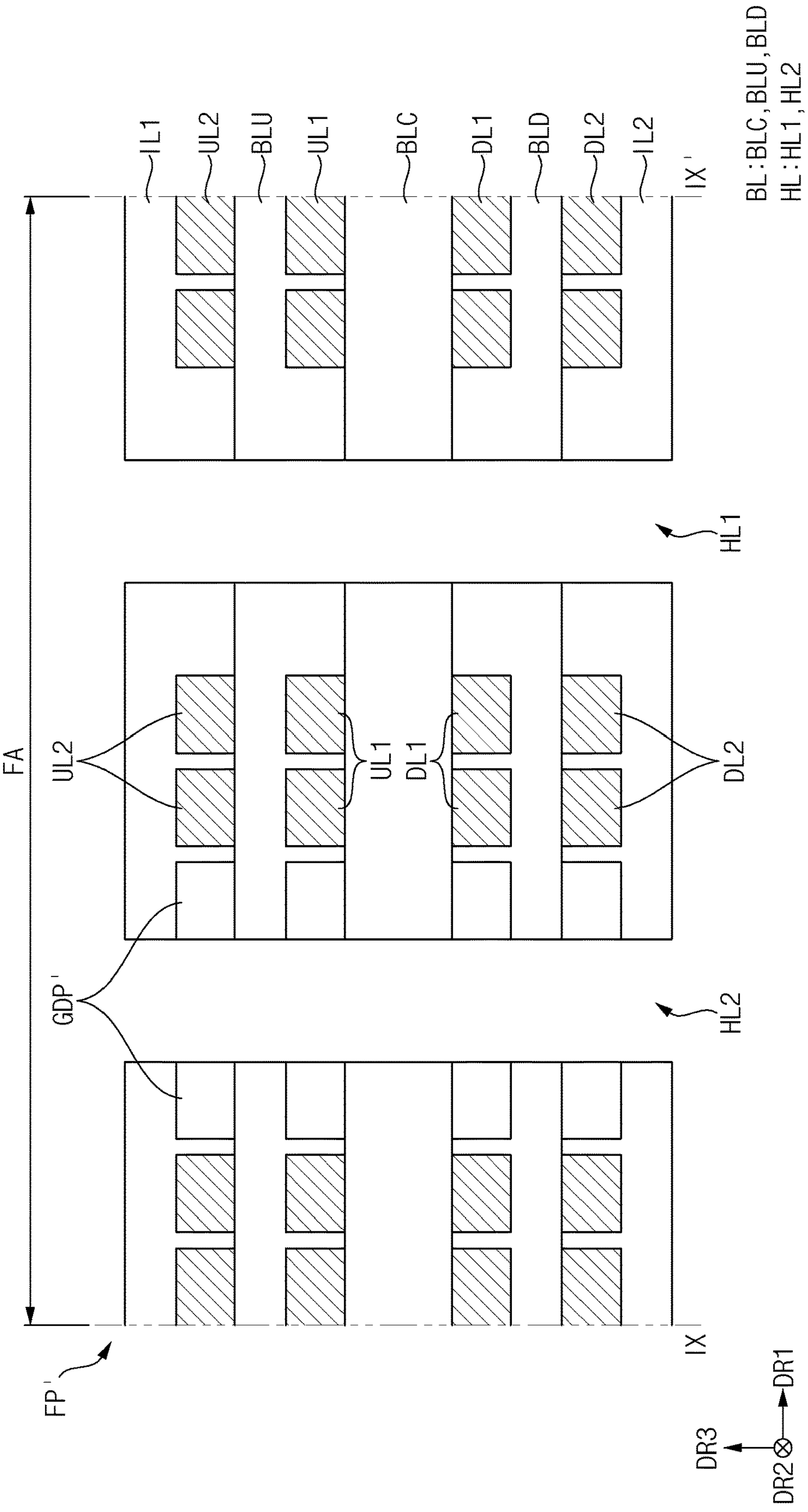

As illustrated in FIGS. 26 and 27, the through holes HL may be formed by removing a portion of the dummy patterns DMP" and a portion of the base layer BL. Specifically, the portion of each of the dummy patterns DMP" and the portion of the base layer BL that overlap the cutting area CA may be removed. More specifically, a portion of the head portion DMP"-HD and the entirety of the rod portion DMP"-RD may be removed.

Accordingly, the through holes HL that penetrate the base layer BL, the first insulating layer IL1, and the second insulating layer IL2 in the thickness direction may be formed. In addition, the remaining portion of the head portion DMP"-HD may form the guide pattern GDP'. The guide pattern GDP' may surround the end portion HL-ED of each of the through holes HL. The guide pattern GDP' may have a shape corresponding to a shape of the curved pattern RP.

Figure 28:
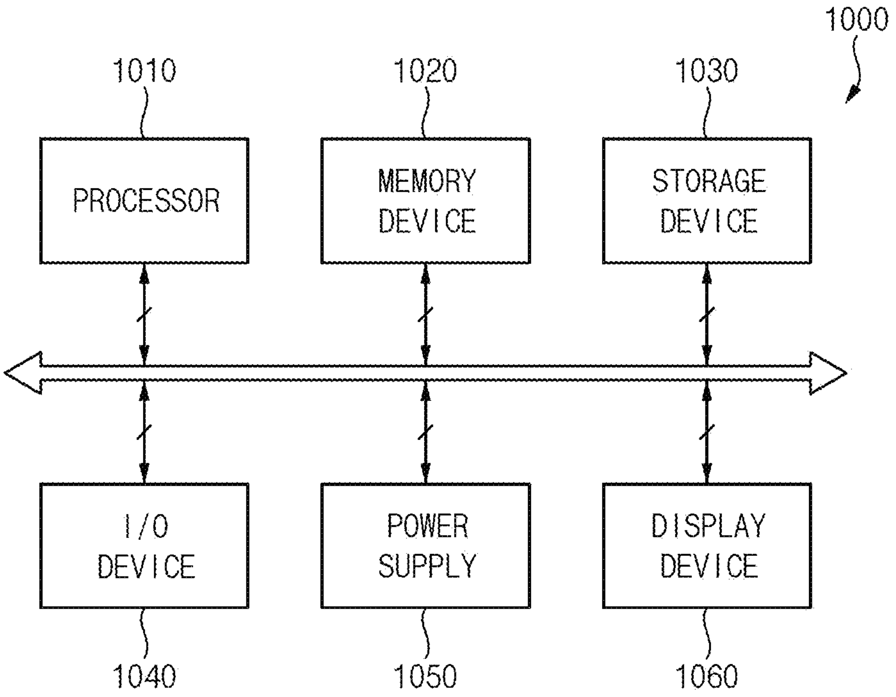
FIG. 28 is a block diagram illustrating an electronic device according to an embodiment of the present disclosure.

FIG. 28 is a block diagram illustrating an electronic device according to an embodiment of the present disclosure.

Referring to FIG. 28, an electronic device 1000 may include a processor 1010, a memory device 1020, a storage device 1030, an input/output (I/O) device 1040, a power supply 1050, and a display device 1060. The display device 1060 may be the display device DD of FIG. 1. In addition, the electronic device 1000 may further include a plurality of ports for communicating with a video card, a sound card, a memory card, a universal serial bus (USB) device, other systems, and the like.

In an embodiment, the electronic device 1000 may be implemented as a smart phone. However, the electronic device 1000 is not limited thereto. For example, the electronic device 1000 may be implemented as a smart pad, a smart watch, a tablet PC, a car navigation system, a computer monitor, a laptop, a head mounted display ("HMD") device, and the like.

The processor 1010 may perform various computing functions. The processor 1010 may be a microprocessor, a central processing unit ("CPU"), an application processor ("AP"), and the like. The processor 1010 may be coupled to other components through an address bus, a control bus, a data bus, and the like. In an embodiment, the processor 1010 may be coupled to an extended bus such as a peripheral component interconnection ("PCI") bus.

The memory device 1020 may store data for operations of the electronic device 1000. For example, the memory device 1020 may include at least one non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, and the like and/or at least one volatile memory device such as a dynamic random access memory ("DRAM") device, a static random access memory ("SRAM") device, a mobile DRAM device, and the like.

The storage device 1030 may include a solid-state drive ("SSD") device, a hard disk drive ("HDD") device, a CD-ROM device, and the like. The I/O device 1040 may include an input device such as a keyboard, a keypad, a mouse device, a touch-pad, a touch-screen, and the like, and an output device such as a printer, a speaker, and the like. In some embodiments, the I/O device 1040 may include the display device 1060.

The power supply 1050 may provide power for operations of the electronic device 1000. In other words, the power supply 1050 may provide power to the display device 1060 or the display panel (DP, refer to FIG. 4). The display device 1060 may be connected to other components through buses or other communication links.

Embodiments of the present disclosure may be applied to various display devices. For example, embodiments of the present disclosure are applicable to display devices for vehicles, ships and aircraft, portable communication devices, exhibition or information transmission displays, medical display devices, and more.

The foregoing is illustrative of the embodiments of the present disclosure, and is not to be construed as limiting thereof. Although a few embodiments have been described with reference to the figures, those skilled in the art will readily appreciate that many variations and modifications may be made thereto without departing from the spirit and scope of the present disclosure as set forth in the appended claims.

What is claimed is:

1. A digitizer comprising:

a base layer including a folding portion, a first non-folding portion and a second non-folding portion spaced apart from the first non-folding portion in a first direction with the folding portion interposed therebetween, wherein the folding portion includes a plurality of through holes;

a guide pattern disposed on the base layer in the folding portion and surrounding at least a part of each of the plurality of through holes in a plan view; and a sensing line disposed on the base layer in the folding portion, positioned between the plurality of through holes in the plan view, and extending in the first direction, curving along edges of the plurality of through holes.

2. The digitizer of claim 1, wherein the base layer further includes:

a middle base layer;

an upper base layer disposed above the middle base layer; and a lower base layer disposed under the middle base layer.

3. The digitizer of claim 2, wherein the sensing line includes:

a first upper sensing line disposed on an upper surface of the middle base layer;

a second upper sensing line disposed on an upper surface of the upper base layer;

a first lower sensing line disposed on a lower surface of the middle base layer; and a second lower sensing line disposed on a lower surface of the lower base layer.

4. The digitizer of claim 2, further comprising:

a dummy line disposed in the first non-folding portion and the second non-folding portion and extending in the first direction, wherein the dummy line is disposed only on the upper base layer.

5. The digitizer of claim 1, wherein the guide pattern entirely surrounds each of the plurality of through holes in the plan view.

6. The digitizer of claim 1, wherein the sensing line includes a curved pattern with a predetermined curvature in the plan view.

7. The digitizer of claim 6, wherein each of the plurality of through holes includes an end portion with a predetermined curvature, and wherein the guide pattern has a shape corresponding to a shape of the curved pattern and surrounds the end portion.

8. The digitizer of claim 1, wherein the base layer further includes:

a matrix; and a plurality of fiber lines disposed in the matrix, alternately arranged with each other, and having a woven shape in the plan view.

9. An electronic device comprising:

a display panel including a light emitting element;

a power supply configured to provide power to the display panel; and a digitizer disposed under the display panel, wherein the digitizer comprises:

a base layer including a folding portion, a first non-folding portion and a second non-folding portion spaced apart from the first non-folding portion in a first direction with the folding portion interposed therebetween, wherein the folding portion includes a plurality of through holes;

a guide pattern disposed on the base layer in the folding portion and surrounding at least a part of each of the plurality of through holes in a plan view; and a sensing line disposed on the base layer in the folding portion, positioned between the plurality of through holes in the plan view, and extending in the first direction, curving along edges of the plurality of through holes.

* * * * *